(12) United States Patent
Mevellec et al.

(10) Patent No.: US 8,119,542 B2
(45) Date of Patent: Feb. 21, 2012

(54) METHOD OF PREPARING AN ELECTRICALLY INSULATING FILM AND APPLICATION FOR THE METALLIZATION OF VIAS

(75) Inventors: Vincent Mevellec, Boulogne Billancourt (FR); José Gonzalez, Paris (FR); Dominique Suhr, Chatenay Malabry (FR)

(73) Assignee: Alchimer, Massy (FR)

( * ) Notice: Subject to any disclaimer, the term of this patent is extended or adjusted under 35 U.S.C. 154(b) by 297 days.

(21) Appl. No.: 12/495,137

(22) Filed: Jun. 30, 2009

(65) Prior Publication Data

US 2010/0003808 A1    Jan. 7, 2010

(30) Foreign Application Priority Data

Jul. 1, 2008  (FR) ...................... 08 54442

(51) Int. Cl.
*H01L 21/31* (2006.01)
(52) U.S. Cl. .............. 438/780; 438/623; 438/781
(58) Field of Classification Search .............. 438/99, 438/623, 780, 781; 427/384
See application file for complete search history.

(56) References Cited

U.S. PATENT DOCUMENTS

| 7,060,624 | B2 | 6/2006 | Andricacos et al. |
| 7,101,792 | B2 | 9/2006 | Kirby et al. |
| 7,148,565 | B2 | 12/2006 | Kim et al. |
| 2008/0152949 | A1 | 6/2008 | Mevellec et al. |
| 2009/0117391 | A1* | 5/2009 | Mevellec et al. ............ 428/430 |

FOREIGN PATENT DOCUMENTS

| FR | 2 910 007 A | 6/2008 |
| WO | WO 01/59178 A1 | 8/2001 |
| WO | 2006/086337 | 8/2006 |
| WO | 2007/099137 | 9/2007 |
| WO | WO 2007/099137 A2 | 9/2007 |
| WO | WO 2007/099218 A1 | 9/2007 |

OTHER PUBLICATIONS

Topol, A.W. et al., "Three-dimensional integrated circuits" (IBM Journal Res. & Dev., No. 4/5, Jul./Sep. 2006, pp. 491-506.
Roucoux, A. et al., "Arene Hydrogenation with a Stabilised Aqueous Rhodium (0) Suspension: A Major Effect of the Surfactant Counter-Anion" Adv. Synth, Catal. 2003, 345, 222-229.
Agarwala, R.C. et al., "Electroless alloy/composite coatings: A review", Sadhana, parts 3 & 4 Jun./Aug. 2003, 28, 475-493.
Lide, David R., Handbook of Chemistry and Physics, 84th Edition, CRC Press, p. 8-44 to 8-45.
Yoshino, M. et al., "All-wet fabrication process for ULSI interconnect technologies", Electrochimica Acta 51 (2005) 916-920.

* cited by examiner

*Primary Examiner* — Kevin M Picardat
(74) *Attorney, Agent, or Firm* — Hamre, Schumann, Mueller & Larson, P.C.

(57) ABSTRACT

The present invention essentially relates to a method of preparing an electrically insulating film at the surface of an electrical conductor or semiconductor substrate, such as a silicon substrate.

Figure 1:
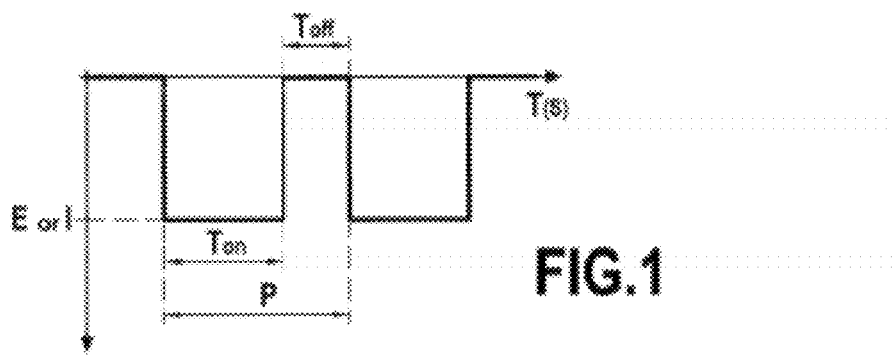

According to the invention, this method comprises:

a) bringing said surface into contact with a liquid solution comprising:

a protic solvent;

at least one diazonium salt;

at least one monomer that is chain-polymerizable and soluble in said protic solvent;

at least one acid in a sufficient quantity to stabilize said diazonium salt by adjusting the pH of said solution to a value less than 7, preferably less than 2.5;

b) the polarization of said surface according to a potentio- or galvano-pulsed mode for a duration sufficient to form a film having a thickness of at least 60 nanometers, and preferably between 80 and 500 nanometers.

Application: Metallization of through-vias, especially of 3D integrated circuits.

24 Claims, 14 Drawing Sheets

METHOD OF PREPARING AN ELECTRICALLY INSULATING FILM AND APPLICATION FOR THE METALLIZATION OF VIAS

The present invention relates generally to a method for coating in protic media a surface of a substrate, in particular a resistive silicon-based substrate, with an insulating layer capable of being coated with a copper diffusion barrier layer.

The essential application of the invention is in the field of microelectronics for the metallization, particularly with copper, of vias (called through-silicon vias or through-wafer vias or through-wafer interconnects), the keystone for the three-dimensional (3D) integration, or vertical integration, of electronic chips (or dies). It also has an application in other fields of electronics where a substrate comprising vias must be electrically insulated and covered with a layer of copper. In this context it is possible to cite the fabrication of elements for interconnection between printed circuit boards (or printed wire boards), or that of passive elements, such as inductors, or electromagnetic elements in integrated circuits or microelectromechanical systems.

Current electronic systems mostly consist of several integrated circuits, or components, and each integrated circuit fulfils one or more functions. For example, a computer comprises at least one microprocessor and several memory circuits. Each integrated circuit usually corresponds to an electronic chip in its own package. The integrated circuits are soldered to or plugged into, for example, a printed circuit board (PCB) which ensures the connection between the integrated circuits.

The permanent need to increase the functional density of electronic systems has led, according to a first approach, to the system-on-chip concept, with all the components and circuit units necessary to implement all the system functions then being produced on the same chip without using the printed circuit support. In practice it is nonetheless very difficult to obtain a high-performance system on chip as the fabrication methods for logic and memory circuits, for example, differ very substantially. The system-on-chip approach therefore leads to the acceptance of compromises with respect to the performance of various functions produced on the same chip. In addition, the size of such chips and their fabrication efficiency are reaching the limits of their economic feasibility.

A second approach consists in fabricating in one and the same package a module ensuring the interconnection of several integrated circuits, which may then come from the same semiconductor substrate or from different substrates. The package thus obtained, or the multichip module (MCM), is thus presented in the form of a single component. This MCM approach makes it possible to obtain a higher interconnection density and therefore better performance than a conventional PCB approach. Nonetheless it is not fundamentally distinguished from the PCB approach. Apart from the bulk and the weight of the package, the performance of an MCM remains limited by the parasitic elements associated with the length of the connections from the substrate and with the wire bonding connecting the substrate or the chips to the pins of the package.

A third approach, called three-dimensional (3D) integration or vertical integration, is characterized by the fact that the chips are superposed and connected to each other by vertical interconnections. The stack obtained thus comprises several layers or strata of active components or chips, and constitutes a 3D integrated circuit (or 3D IC).

The benefits of 3D integration are based simultaneously on:

(1) improvement in performance, e.g. reduction in propagation time and in dissipated power, increase in the operating speed of the system associated with the accelerated communication between the functional units, increase in the bandwidth of each functional unit, increase in noise immunity;

(2) improvement in cost, e.g. increase in integration density, improved fabrication efficiency due to the use of the generation of electronic chip most appropriate for each functional unit, improvement in reliability; and (3) the possibility of producing highly integrated systems by stacking heterogeneous technologies (or co-integration), i.e. employing different materials and/or different functional components.

As a result, 3D integration today constitutes an indispensable alternative to the conventional approaches, which are reaching their limits in terms of performance, functional diversification and production costs. The foundations and advantages of 3D integration have been described, for example, in: A. W. Topol et al., "*Three-dimensional integrated circuits*" ISM Journal Res. & Dev., no. 4/5 July/September 2006, 50, 491-506.

After stacking, for example by bonding, the chips may be individually connected to the pins of the package by wire bonding. The interconnection of the chips to each other is generally carried out by employing through-vias.

Thus, the elementary technologies necessary for the production of 3D integrated circuits comprise in particular the thinning of silicon wafers, alignment of the layers, bonding of the layers, etching and metallization of the through-vias within each layer.

The thinning of silicon wafers may be carried out before the fabrication of the through-vias (e.g. U.S. Pat. No. 7,060, 624, U.S. Pat. No. 7,148,565).

Alternatively, the etching and the metallization of vias may be carried out before thinning the silicon wafer (e.g. U.S. Pat. No. 7,060,624, U.S. Pat. No. 7,101,792). In this case, closed vias or blind vias are etched in the silicon, then metallized through to the desired depth before thinning the silicon wafer in order thus to obtain through-vias.

The good electrical conductivity of copper and its high resistance to the phenomenon of electromigration, i.e. the low migration of copper atoms under the effect of the electrical current density which can be an important cause of failure, make it in particular a material of choice for the metallization of vias.

The vias of 3D integrated circuits are generally made in a manner similar to the "Damascene method" used in the field of microelectronics for the fabrication of elements for the interconnection of integrated circuits, according to a series of steps comprising:

the etching of vias in or through the silicon wafer;
the deposition of an insulating dielectric layer;
the deposition of a barrier layer, or liner, serving to prevent the migration or diffusion of copper;
the filling of the vias by electrodeposition of copper; and
the elimination of excess copper by chemical-mechanical polishing.

Due to the high resistivity of the materials constituting it, the barrier layer generally has too high a resistance to allow homogeneous or uniform copper deposition at the wafer scale by direct electrochemical means, a phenomenon known to those skilled in the art by the term ohmic drop.

It is therefore necessary, prior to the step of filling by copper electrodeposition, to cover the barrier layer with a thin layer of copper metal called the seed layer.

This seed layer may be produced in several ways: by methods of physical vapour deposition or chemical vapour deposition (PVD and CVD respectively), or alternatively by deposition in a liquid medium using the technology called electrografting.

The insulating dielectric layer may be:
- either inorganic in nature (silicon oxide $SiO_2$, silicon nitride $Si_3N_4$ or aluminium oxide, for example),
- or organic in nature (parylene C, N or D, polyimide, benzocyclobutene, polybenzoxazole for example).

Whether organic or inorganic in nature, the insulating dielectric layer is usually dry-deposited in order to obtain a uniform insulating layer in the known methods of fabricating through-vias.

Thus in WO 2006/086337 it is recommended to produce the insulating dielectric layer, preferably formed of parylene, by a vapour deposition method.

The methods using chemical vapour deposition specifically recommended in this prior document are relatively expensive due to the high price of the consumables (precursors) and above all of the equipment necessary for their implementation, along with their low efficiency.

The methods using physical vapour deposition also envisaged in this prior document do not make it possible to obtain coatings of a uniform thickness at every point of the surface of the through-vias of high-density 3D integrated circuits, for which form factors are generally very important.

The U.S. Pat. No. 6,770,558 describes a method of fabricating through-vias in which the insulating dielectric layer, which is inorganic in nature ($SiO_2$), is produced either by thermal oxidation or by chemical vapour deposition.

The same problems result from this as those mentioned previously in relation to the method described in document WO 2006/086337.

In order to avoid the problems linked with dry deposition methods, one possible solution lies in the use of a wet deposition method.

Various documents from the prior art that do not directly relate to the fabrication of through-vias of 3D integrated circuits describe methods for preparing an organic film at the surface of a substrate, which may be an electrical conductor or semiconductor, making use of electrografting a polymer. Electrografting is a wet deposition technique based on the initiation then the electro-induced polymerization, by chain propagation, of electroactive monomers on the surface to be covered.

In general terms, electrografting requires:
- on the one hand, the use of a liquid solution containing an initiator compound and a monomer; and
- on the other hand, an electrochemical protocol making possible the formation of polymer film at the surface of the substrate to be coated.

Such a method of preparing an organic film by electrografting is described, for example, in the international patent application WO 2007/099137.

This known method uses:
- on the one hand, an electrografting solution containing at least one diazonium salt and a chain-polymerizable monomer; and
- on the other hand, an electrochemical protocol for deposition by cyclic voltammetry.

The polymerizable monomers generally used in this prior document are not soluble in protic media, so that the electrografting solution generally contains an aprotic solvent such as in particular dimethylformamide, the use of which poses problems in environmental terms.

Document WO 2007/099218 also describes a method for preparing an organic film by electrografting in which the liquid electrografting solution contains a protic solvent and at least one radical polymerization initiator that is soluble in this protic solvent.

As the polymerizable monomers used in this prior document are weakly soluble in protic media, it is recommended to add at least one surfactant to the electrografting solution so as to make the polymerizable monomer soluble in micelles.

However, the use of surfactants limits the monomer concentration in the electrografting solution to values too low to allow a use of this method meeting the industrial constraints.

In addition, the surfactants used are capable of being adsorbed on the surface to be coated and therefore of being introduced into the organic film formed on the substrate. This would result in a deterioration of the insulating properties of the film thus prepared.

Moreover, and as in the case of the previously discussed document WO 2007/099137, it has been observed that the use of an electrografting protocol using cyclic voltammetry does not allow growth kinetics of the film that is compatible with industrial demands.

In these conditions, the aim of the present invention is to solve the technical problem consisting in the provision of a new method of preparing an organic film at the surface of an electrical conductor or semiconductor substrate by electrografting, which method is:
- especially suited to the formation of an electrically insulating film in the fabrication of through-vias, in particular of 3D integrated circuits; and
- able to be implemented wet in conditions compatible with industrial constraints, while leading to a continuous and conformal deposition for a large range of form factors and having excellent adhesion to the substrate.

The present invention also has the aim of solving the aforementioned technical problem by making it possible to produce an insulating film that is itself capable of being wet-coated by a layer forming a copper diffusion barrier.

It has been discovered, and this constitutes the foundation of the present invention, that it was possible to solve the aforementioned technical problem in a manner satisfactory at the industrial scale by employing:
- on the one hand, an electrografting solution that is protic in nature, and in particular an aqueous solution in which the film precursor is chosen from the monomers that are soluble in this solvent; and
- on the other hand, an electrografting protocol in pulsed mode making possible the formation of a continuous and uniform film with a growth kinetics compatible with industrial constraints.

Thus, according to a first aspect, the present invention relates to a method of preparing an electrically insulating film at the surface of an electrical conductor or semiconductor substrate, such as a silicon substrate, characterized in that it comprises:

a) bringing said surface into contact with a liquid solution comprising:
- a protic solvent;
- at least one diazonium salt;
- at least one monomer that is chain-polymerizable and soluble in said protic solvent;
- at least one acid in a sufficient quantity to stabilize said diazonium salt by adjusting the pH of said solution to a value less than 7, preferably less than 2.5;

b) the polarization of said surface according to a potentio- or galvano-pulsed mode for a duration sufficient to form a film having a thickness of at least 80 nanometers, and preferably between 100 and 500 nanometers.

Advantageously, the protic solvent used in the aforementioned method is chosen from the group consisting of water, preferably deionized or distilled water; the hydroxylated solvents, in particular alcohols having 1 to 4 carbon atoms; carboxylic acids having 2 to 4 carbon atoms, in particular formic acid and acetic acid, and mixtures thereof.

Water constitutes the protic solvent currently preferred in the context of the invention.

Generally speaking, many diazonium salts are capable of being used for the implementation of the method according to this first aspect of the invention, and in particular the diazonium salts mentioned in the document WO 2007/099218.

Thus, according to a particular characteristic, the diazonium salt is an aryldiazonium salt chosen from the compounds of the following formula (I):

   (I)

in which:

A represents a monovalent anion,

R represents an aryl group.

As an example of an aryl group R, it is possible in particular to mention the unsubstituted, mono- or polysubstituted aromatic or heteroaromatic carbon structures, consisting of one or more aromatic or heteroaromatic rings, each comprising 3 to 8 atoms, the heteroatom(s) being chosen from N, O, S, or P; the optional substituent(s) preferably being chosen from electron-attracting groups such as $NO_2$, COH, ketones, CN, $CO_2H$, $NH_2$, esters and the halogens.

The particularly preferred groups R are the nitrophenyl and phenyl groups.

Among the compounds of formula (I) above, A may especially be chosen from inorganic anions such as halides like $I^-$, $Br^-$ and $Cl^-$, haloboranes such as tetrafluoroborane, and organic anions such as alcoholates, carboxylates, perchlorates and sulphates.

According to a preferred embodiment of the invention, the diazonium salt of the aforementioned formula (I) is chosen from phenyldiazonium tetrafluoroborate, 4-nitrophenyldiazonium tetrafluoroborate, 4-bromophenyldiazonium tetrafluoroborate, 2-methyl-4-chlorophenyldiazonium chloride, 4-benzoylbenzenediazonium tetrafluoroborate, 4-cyanophenyldiazonium tetrafluoroborate, 4-carboxyphenyldiazonium tetrafluoroborate, 4-acetamidophenyldiazonium tetrafluoroborate, 4-phenylacetic acid diazonium tetrafluoroborate, 2-methyl-4-[(2-methylphenyl)-diazenyl]benzenediazonium sulphate, 9,10-dioxo-9,10-dihydro-1-anthracenediazonium chloride, 4-nitrophthalenediazonium tetrafluoroborate, and napthalenediazonium tetrafluoroborate, 4-aminophenyldiazonium chloride.

Preferably, the diazonium salt will be chosen from phenyldiazonium tetrafluoroborate and 4-nitrophenyldiazonium tetrafluoroborate.

The diazonium salt is generally present within the liquid electrografting solution in a quantity between $10^{-3}$ and $10^{-1}$M, preferably between $5 \times 10^{-3}$ and $3 \times 10^{-2}$M.

Generally speaking, the electrografting solution contains at least one monomer that is chain-polymerizable and soluble in the protic solvent.

The choice of a monomer soluble in the protic solvent constitutes an essential and original feature of the invention.

"Soluble in a protic solvent" is here understood to denote any monomer or mix of monomers whose solubility in the protic solvent is at least 0.5M.

Those skilled in the art will have no difficulty in choosing the monomers capable of being used in the context of the present invention.

These monomers will advantageously be chosen from vinyl monomers soluble in the protic solvent and satisfying the following general formula (II):

II in which the, identical or different, groups $R_1$ to $R_4$ represent a monovalent non-metal atom such as a halogen atom or a hydrogen atom, or a saturated or unsaturated chemical group such as a $C_1$-$C_6$ alkyl or aryl, a —$COOR_5$ group in which $R_5$ represents a hydrogen atom or a $C_1$-$C_6$ alkyl, nitrile, carbonyl, amine or amide group.

Preferably, water-soluble monomers will be used. Such monomers will advantageously be chosen from ethylenic monomers comprising pyridine groups such as 4-vinylpyridine or 2-vinylpyridine, or from ethylenic monomers comprising carboxylic groups such as acrylic acid, methacrylic acid, itaconic acid, maleic acid, fumaric acid and their sodium, potassium, ammonium or amine salts, amides of these carboxylic acids and in particular acrylamide and methacrylamide along with their N-substituted derivatives, their esters such as 2-hydroxyethyl methacrylate, glycidyl methacrylate, dimethylamino- or diethylamino (ethyl or propyl) (meth)acrylate and their salts, quaternized derivatives of these cationic esters such as, for example, acryloxyethyl trimethylammonium chloride, 2-acrylamido-2-methylpropane sulphonic acid (AMPS), vinylsulphonic acid, vinylphosphoric acid, vinyllactic acid and their salts, acrylonitrile, N-vinylpyrrolidone, vinyl acetate, N-vinylimidazoline and its derivatives, N-vinylimidazole and derivatives of the diallylammonium type such as dimethyldiallylammonium chloride, dimethyldiallylammonium bromide and diethyldiallylammonium chloride.

The quantitative composition of the liquid electrografting solution may vary within broad limits.

Generally speaking, this solution comprises:

at least 0.3M of polymerizable monomer(s), at least $5 \times 10^{-3}$M of diazonium salt(s), the molar ratio of the polymerizable monomer(s) to the diazonium salt(s) being between 10 and 300.

As previously mentioned, the use of an electrografting protocol in pulsed mode constitutes another essential and original feature of the invention, to the extent that this particular protocol makes it possible, completely unexpectedly and in contrast to a cyclic voltammetry electrografting protocol, to obtain a continuous and uniform film with a growth kinetics compatible with industrial constraints.

Generally speaking, the polarization of the surface to be covered by the film is produced in a pulsed mode, each cycle of which is characterized by:

a total period P of between 10 ms and 2 s, preferably of around 0.6 s;

a polarization time $T_{on}$ of between 0.01 and 1 s, preferably around 0.36 s, during which a potential difference or a current is applied to the surface of the substrate; and an idle period with zero potential or current of a duration of between 0.01 and 1 s, preferably of around 0.24 s.

The method of preparing an electrically insulating film which has just been described is especially useful in the preparation of through-vias, in particular of 3D integrated circuits, for constituting the internal electrically insulating layer designed to be coated with the barrier layer serving to prevent copper migration or diffusion.

Advantageously, the aforementioned barrier layer is itself produced by a wet deposition method, preferably in a liquid medium of protic nature for reasons that will straightforwardly be understood.

In this context, it has been discovered, and this constitutes an original feature of the invention, that the barrier layer serving to prevent copper migration or diffusion may advantageously consist of a nickel- or cobalt-based metal film.

Thus, according to a second aspect, the invention relates to a method of preparing a coating of an electrical conductor or semiconductor substrate, said coating consisting of a first layer forming an electrically insulating film and a second layer forming a copper diffusion barrier, characterized in that:

A. said first layer is produced by employing the previously described method;

B. said second layer is produced by:
  a) the formation by wet process, at the surface of the first layer thus obtained, of an organic film containing particles, especially nanoparticles, of metals or metal alloys, in particular of nickel or cobalt;
  b) bringing the film thus formed into contact with a liquid solution containing at least one metal salt, preferably of the same nature as the metal incorporated into the organic film, and at least one reducing agent under conditions enabling the formation of a metal film having a thickness of at least 100 nm.

According to a first embodiment of the invention, the aforementioned step B.a) is carried out by bringing the free surface of the aforementioned internal layer into contact with a liquid solution containing:
  at least one solvent, preferably a protic solvent;
  at least one diazonium salt;
  at least one monomer that is chain-polymerizable and soluble in said solvent; and
  at least one chemical initiator enabling the formation of radical entities from said diazonium salt.

The protic solvent and the diazonium salt employed in the aforementioned step B.a) may be of the same nature as the corresponding compounds used in step A.

The use of an aprotic solvent, such as dimethylformamide, acetone or dimethyl sulphoxide, is nonetheless conceivable in the scope of implementing step B.a).

The monomer that can be chain-polymerized by free radical methods may vary in nature.

It will especially be chosen from the monomers described in document WO 2007/099218.

Preferably, the water-soluble monomers that have been described in relation to step A will also be used.

The chemical initiator capable of being used to enable the formation of the free radical entity from the diazonium salt will generally be chosen from a metal reducing agent in finely divided form or an organic or inorganic base in sufficient proportions for the pH of the liquid solution to be greater than or equal to 4.

Preferably within the context of the invention, the chemical initiator is a metal reducing agent chosen from iron, zinc or nickel, in finely divided form such as filings for example.

The quantitative composition of the liquid solution used in step B.a) may vary within broad limits.

Generally speaking, this solution comprises:
  at least 0.3M of polymerizable monomer(s),
  at least $5 \times 10^{-2}$M of diazonium salt(s).

As will be understood, step B.a) enables the formation of an organic film under non-electrochemical conditions that are particularly advantageous in environmental terms.

According to the invention, the organic film thus obtained is processed in order to contain particles, especially nanoparticles, of metals or metal alloys, in particular of nickel or cobalt.

To this end, this film is brought into contact with a suspension containing said particles.

As will be understood, the nature of the monomer used for the preparation of the organic film in step B.a) and the nature of the particles will be chosen so that the film obtained in step B.a) and said particles have sufficient physico-chemical affinity to link said particles to said film and allow a subsequent metallization.

Generally speaking, the particles contained in the organic film will consist of metals or metal alloys, these metals possibly being chosen especially from the noble metals and the transition metals, along with their alloys. These metals may be alloyed with elements such as phosphorus or boron or a mixture of these components.

Advantageously, particles of nickel or cobalt alloyed with boron will be used.

These particles preferably have the form of nanoparticles preferably having an average size of less than 25 nanometers and more preferably still less than 10 nanometers.

Generally speaking, the incorporation of the particles will be carried out using a colloidal suspension of these particles.

In the particular case of nanoparticles of nickel alloyed with boron, this suspension may be carried out by reaction, in the presence of a surfactant stabilizing agent (A. Roucoux et al., *Adv. Synth. & Catal.*, 2003, 345; 222-229) such as cetyltrimethylammonium bromide, between a metal precursor, such as nickel sulphate, and a reducing agent such as sodium borohydride, making possible the synthesis of zero-valent metal particles in colloidal form.

The particles present in the organic film obtained in step B.a) enable the subsequent preparation of a metal coating by a non-electrochemical, generally called "electroless", method (R. C. Agarwala et al., *Sadhana*, parts 3&4 June/August 2003, 28, 475-493).

To this end, the organic film containing metal particles is brought into contact with a liquid solution containing:
  at least one metal salt, preferably of the same nature as the metal incorporated into the organic film;
  a stabilizing agent; and
  at least one reducing agent;
in conditions enabling the formation of a metal film having a thickness of at least 100 nanometers.

Advantageously, the aforementioned metal salt may be chosen from the group consisting of the acetate, acetylacetonate, hexafluorophosphate, nitrate, perchlorate, sulphate or tetrafluoroborate of the aforementioned metal.

Advantageously, the aforementioned reducing agent may be chosen from the group consisting of hypophosphorous acid and its salts, borane derivatives ($NaBH_4$, DMAB), glucose, formaldehyde and hydrazine.

Advantageously, the aforementioned stabilizing agent is chosen from the group consisting of ethylenediamine, an acetate, a succinate, a malonate, an aminoacetate, a malate or a citrate of an alkali metal.

According to a second embodiment of the preparation method according to the second aspect of the invention, in the case where the chain-polymerizable monomer used in step A.a) is a vinylpyridine, preferably 4-vinylpyridine, step B.a)

is carried out by bringing the free surface of the internal layer of polyvinylpyridine into contact with a liquid solution comprising:

at least one solvent, preferably a protic solvent;

at least one polymer that is soluble in said solvent and comprising functional groups capable of bonding with the functional groups of the polyvinylpyridine by hydrogen bonds or Van der Waals bonds, said polymer being chosen from the polymers containing one or more functional groups chosen from the following functional groups: hydroxyl, (primary or secondary) amine, ammonium, carboxylic acid, carboxylic acid salts, (cyclic or linear) carboxylic anhydride, amide: $C(=O)NHR$ where R represents a hydrogen atom or an alkyl group having 1 to 6 carbon atoms, an amino acid, phosphonic acid, phosphonic acid salts, phosphoric acid, phosphoric acid salts, sulphonic acid, sulphonic acid salts, sulphuric acid, sulphuric acid salts, succinamic acid, succinamic acid salts, phthalimide, phthalimide salts, $Si(OH)_n$ where n is an integer between 1 and 3; for a sufficient duration to enable the formation of said hydrogen or Van der Waals bonds.

Preferably, the protic solvent used will be water and the polymer will be a water-soluble polymer.

According to a currently preferred embodiment of the invention, the chain-polymerizable monomer used in step A.a) is 4-vinylpyridine and the soluble polymer used in step B.a) is an acrylic polyacid.

The method of preparing a bilayer coating (insulator/barrier layer) that has just been described is especially useful in the preparation of through-vias, especially of integrated circuits, for constituting the internal structure intended to be coated with a copper seed layer enabling the metallization of the through-vias.

Advantageously, the aforementioned copper seed layer is itself produced by a wet deposition method, preferably in a liquid medium.

Thus, according to a third aspect, the invention relates to a method of preparing a coating of an electrical conductor or semiconductor substrate, said coating consisting of an internal first layer forming an electrically insulating film obtained according to the previously described step A., an intermediate second layer forming a copper diffusion barrier obtained according to the previously described step B., and a third, external copper seed layer, which layer is produced by:

C. a) bringing the free surface of the second layer into contact with a liquid solution comprising:
at least one solvent;
copper ions in a concentration of between 14 and 120 mM;
ethylenediamine;
the molar ratio of ethylenediamine to copper being between 1.80 and 2.03;
the pH of said composition being between 6.6 and 7.5;
b) polarization of said free surface of the second layer for a sufficient duration to form said third layer.

As will be understood, step C. makes it possible to carry out metallization of the vias.

It has been shown that the liquid solutions employed in step C. make it possible, completely surprisingly, to obtain a copper seed layer leading to a particularly high coverage rate (greater than 99%) of the substrate including in the most critical areas of the vias, and this even when the structure has a high form factor (aspect ratio greater than 3:1, or even of the order of 10 to 15:1) and a relatively high via volume (from $0.8 \times 10^1$ to $5 \times 10^6$ μm$^3$). These liquid solutions are therefore perfectly compatible with a use at the industrial scale.

One preferred family of liquid solutions employed in step C. comprises those whose copper ions are present in a concentration of between 16 and 64 mM.

Another preferred family of liquid solutions employed in step C. comprises those whose molar ratio of copper ions to ethylenediamine is between 1.96 and 2.00.

Although there is no restriction in principle on the nature of the solvent (provided it sufficiently solubilizes the active species of the solution and does not interfere with the electrodeposition), it is preferably water.

In general terms, the liquid solution employed in step C. comprises a source of copper ions, in particular of $Cu^{2+}$ cupric ions.

Advantageously, the source of copper ions is a copper salt such as, in particular, copper sulphate, copper chloride, copper nitrate, copper acetate, preferably copper sulphate, and more preferably still copper sulphate pentahydrate.

According to a particular characteristic, the copper ions are present within the liquid solution employed in step C. in a concentration between 14 and 120 mM; preferably between 16 and 64 mM.

Excellent results have been obtained with liquid solutions in which the source of copper ions is present in a concentration between 16 and 32 mM.

In the liquid solution employed in step C., the molar ratio of copper ions to ethylenediamine is between 1.80 and 2.03, preferably between 1.96 and 2.00.

Generally speaking, the liquid solution employed in step C. has a pH of between 6.6 and 7.5. This value is normally attained when the liquid solution employed in step C. consists only of copper ions and ethylenediamine in the previously mentioned proportions.

The pH of the liquid solution employed in step C. may optionally be adjusted in the aforementioned pH range by means of a buffer such as one of those described in: "Handbook of chemistry and physics—84th edition", David R. Lide, CRC Press, in the case where the liquid solution employed in step C. comprises components other than the source of copper ions and ethylenediamine.

A liquid solution employed in step C. currently preferred, according to the invention, comprises in aqueous solution:
copper ions, in a concentration between 16 and 64 mM;
ethylenediamine;
the molar ratio of the ethylenediamine to the copper ions being between 1.96 and 2.00;
the pH of said composition being between 6.6 and 7.5.

The aforementioned liquid solutions may be employed in a conventional electrodeposition method comprising bringing the surface of a substrate, such as in particular a copper diffusion barrier layer of a structure of through-via type, into contact with a liquid solution such as previously defined and a step of forming a coating on said surface of the substrate, in the course of which said surface is polarized for a sufficient duration to form said coating.

It has been observed, surprisingly, that excellent results in the matter may be obtained using a liquid solution by monitoring, during the electrodeposition procedure implemented in step C., the conditions for bringing the surface to be coated into contact with said liquid solution prior to forming the coating.

It has been observed, completely unexpectedly, that it was possible to improve the adhesion between the copper coating layer produced by electrodeposition and the barrier layer by bringing the surface to be coated into contact with the liquid solution employed in step C. without electrical polarization, i.e. without applying an electrical current or an electrical potential relative to a counter-electrode or relative to a reference electrode at this surface, prior to the electrodeposition step.

An even greater increase in this adhesion has been observed when the surface of the substrate to be coated is kept in contact with the liquid solution employed in step C. (for example through immersion in the electrodeposition composition) for a duration of at least 1 minute, for example around 3 minutes, still prior to the electrodeposition step.

It has been observed that the improvement in the adhesiveness of the seed layer on the barrier layer also makes it possible to improve the adhesion of the "seed layer/filling or thick copper or thick layer" whole, i.e. the "working" adhesiveness of the assembly for which the seed layer is produced.

It is possible, for example, to evaluate this adhesiveness by peeling an adhesive ribbon bonded on the upper surface of the assembly, for example by using a testing machine or a tensile testing machine. The adhesion thus measured, or the interface energy expressed in $J \cdot m^{-2}$, characterizes overall both the adhesiveness of the seed layer on the barrier and that of the thick layer of copper on the seed layer.

There is no restriction in principle on the step of separating the coated substrate from the copper seed layer after the formation of the coating.

It has been observed that it was possible, for example, to obtain a seed layer having a conductivity compatible with the traditional methods of filling vias by electrodeposition by keeping the coated surface under electrical polarization, preferably for a duration of between 1 and 10 seconds, preferably for a duration of between 1 and 5 seconds after its separation from the liquid solution employed in step C.

Thus the liquid solutions employed in step C. will preferably be employed in an electrodeposition method comprising:

a step called the "cold entry" step in the course of which said surface to be coated is brought without electrical polarization into contact with the liquid electrodeposition solution and preferably kept in this state for a duration of at least 1 minute;

a step of formation of the coating in the course of which said surface is polarized for a sufficient duration to form said coating;

a step called the "hot exit" step in the course of which said surface is separated from the liquid electrodeposition solution while it is still electrically polarized.

In this method, the step of forming the coating by electrodeposition is conducted for a sufficient duration to form the desired coating. This duration may easily be determined by those skilled in the art, as the growth of the film is a function of the charge, which is equal to the time integral of the electric current passed into the circuit during the deposition period (Faraday's Law).

In the course of the step of formation of the coating, the surface to be coated may be polarized, either in galvanostatic mode (fixed applied current), or in potentiostatic mode (fixed applied potential, optionally in relation to a reference electrode), or alternatively in pulsed mode (in current or in voltage).

Generally speaking, it has been observed that a particularly satisfactory coating may be obtained by polarization in pulsed mode, preferably so as to apply current steps.

Generally speaking, this step may be carried out by applying current steps corresponding to a maximum current per unit surface area in a range from $0.6 \, mA \cdot cm^{-2}$ to $10 \, mA \cdot cm^{-2}$, and more specifically from $1 \, mA \cdot cm^{-2}$ to $5 \, mA \cdot cm^{-2}$ and to a minimum current per unit surface in a range from $0 \, mA \cdot cm^{-2}$ to $5 \, mA \cdot cm^{-2}$, and preferably of $0 \, mA \cdot cm^{-2}$.

More specifically, the duration of polarization at the maximum current may be between $2 \times 10^{-3}$ and 1.6 seconds, preferably between 0.1 and 0.8 seconds, for example around 0.35 seconds, while the duration of polarization at the minimum current may be between $2 \times 10^{-3}$ and 1.6 seconds, preferably between 0.1 and 0.8 seconds, for example around 0.25 seconds.

The number of cycles to be carried out in the course of this step depends on the desired thickness of the coating.

Generally speaking, those skilled in the art will easily be able to determine the number of cycles to be carried out, knowing that in the aforementioned preferred conditions it has been observed that the rate of deposition is about 0.3 nm per second.

This mode of implementing step C. made it possible to produce copper seed layers having a thickness of between 50 nm and 1 µm on highly resistive substrates with "through-via" structures, the sheet resistance of which may reach 1000 ohms/□, or even several megaohm/sheet.

The present invention therefore covers a method of coating a surface of a substrate, such as in particular the surface of a copper diffusion barrier layer of a "through-via" structure, which comprises bringing said surface into contact with a liquid solution employed in step C. as previously described and a step in the course of which said surface is polarized for a sufficient duration to form said coating.

This coating step C. is particularly useful for producing a copper seed layer having a thickness that may be around 50 nm to 1 µm, preferably from 200 to 800 nm, for example around 300 nm, on the surface of a copper diffusion barrier such as obtained by implementing steps A. and B. in a "through-via" structure.

The methods that have just been described make it possible to fabricate wafers of conductor or semiconductor material, especially made of silicon, with a novel structure.

Thus, according to a final aspect, the subject of the invention is:

a wafer of a conductor or semiconductor material, especially made of silicon, comprising one or more vias, characterized in that the walls of each via are covered with an internal layer made of poly-4-vinylpyridine (P4VP) with a thickness of between 200 and 400 nanometers forming an electrical insulator, which is itself coated with a layer of nickel, optionally alloyed with boron, with a thickness of between 100 and 300 nanometers forming a copper diffusion barrier, which is itself covered with a copper layer with a thickness of between 200 and 500 nanometers forming a seed layer; and a wafer of a conductor or semiconductor material, especially made of silicon, comprising one or more vias, characterized in that the walls of each via are covered with an internal layer made of poly-2-hydroxyethyl methacrylate (PHEMA) with a thickness of between 200 and 400 nanometers forming an electrical insulator, which is itself coated with a layer of nickel, optionally alloyed with boron, with a thickness of between 100 and 300 nanometers forming a copper diffusion barrier, which is itself covered with a copper layer with a thickness of between 200 and 500 nanometers forming a seed layer.

EXAMPLES

The invention will be better understood on reading the description of the following nonlimiting examples with reference to the appended drawings, which respectively show:

FIG. 1: Schematic representation of a pulsed electrografting protocol that can be used according to the invention.

Figure 2:
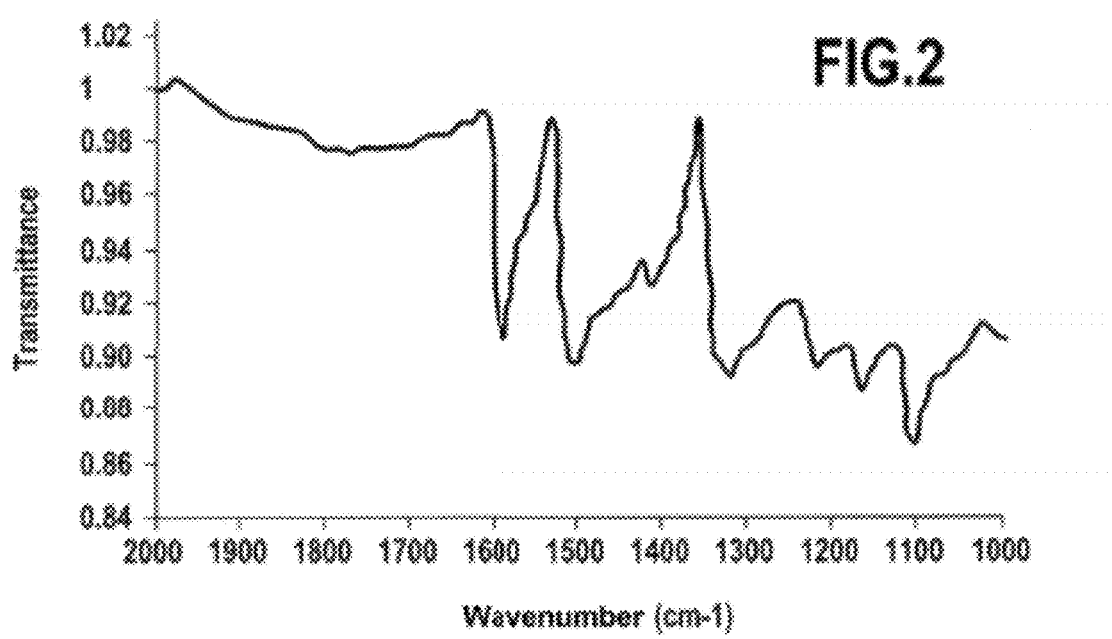

FIG. 2: Infrared ATR-IR spectrum for a P4VP film on n-doped Si obtained in Example 1.

Figure 3:
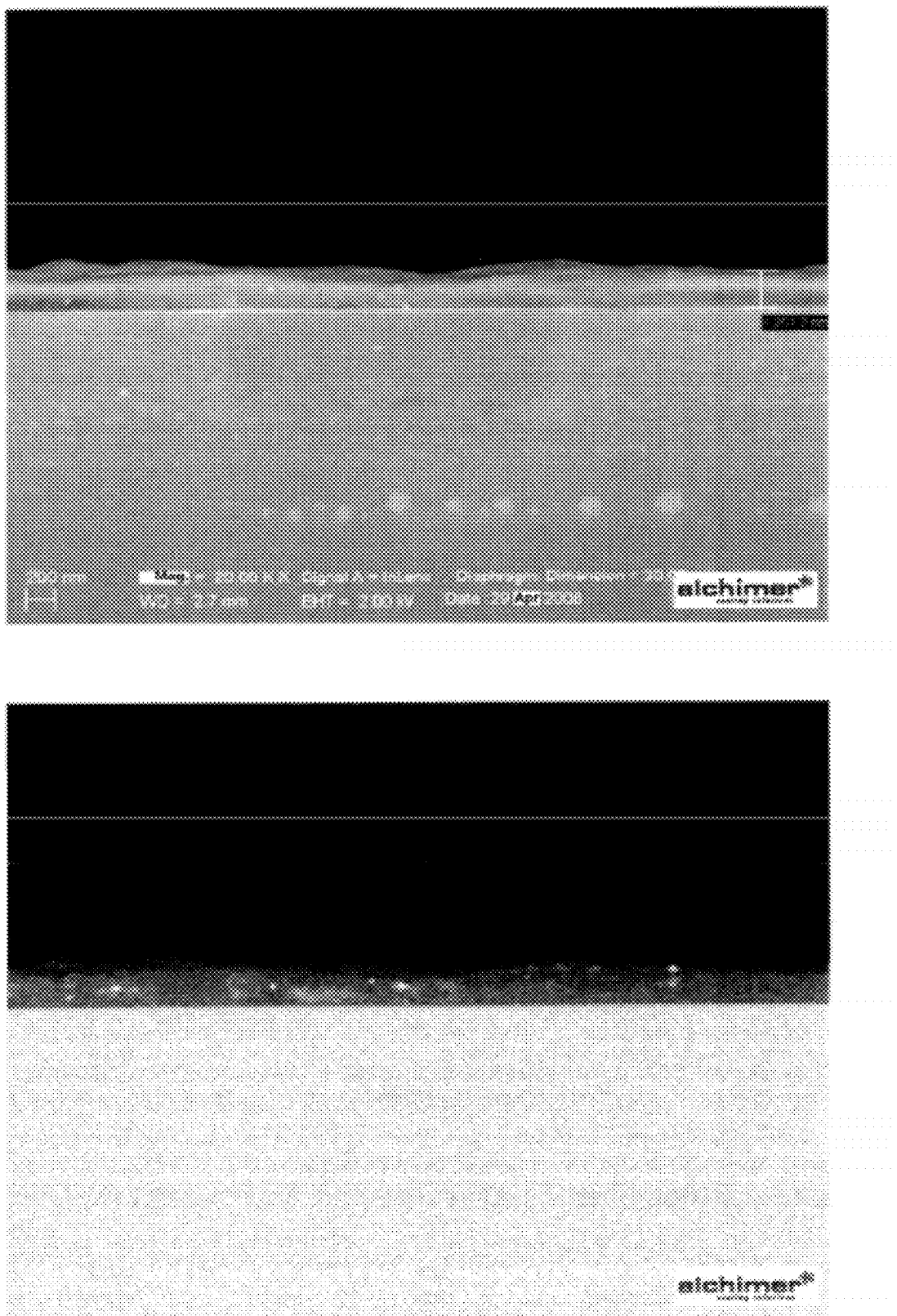

FIG. 3: Scanning electron microscope image of a P4VP film on n-doped Si obtained in Example 1.

Figure 4:
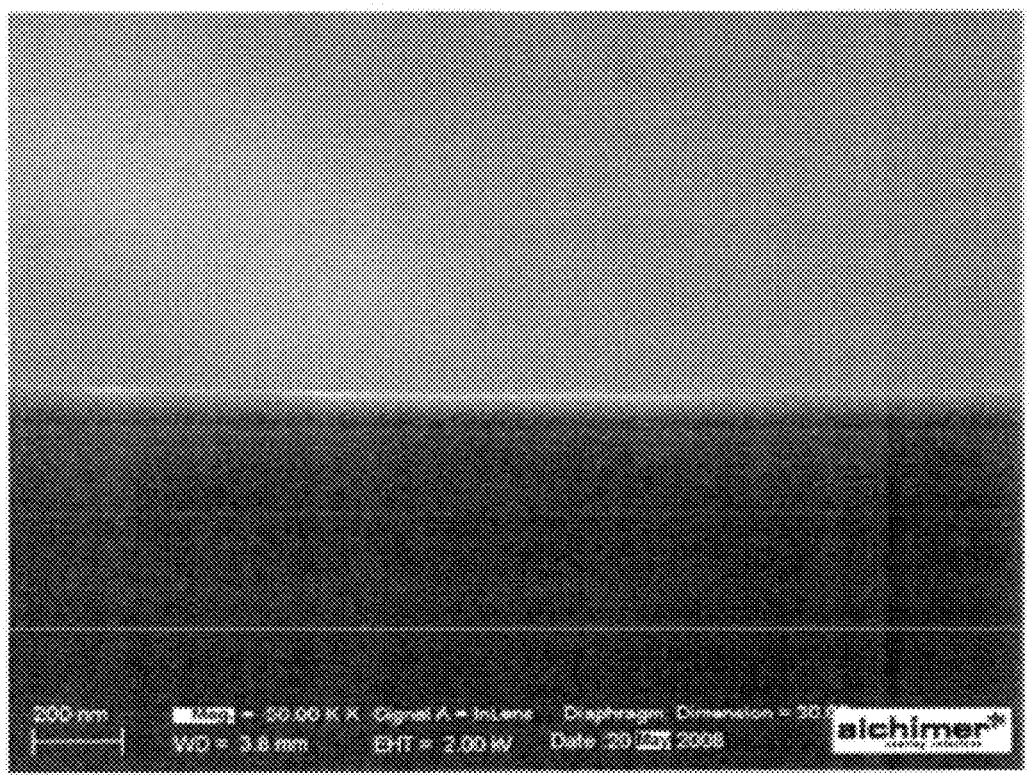
Figure 4:
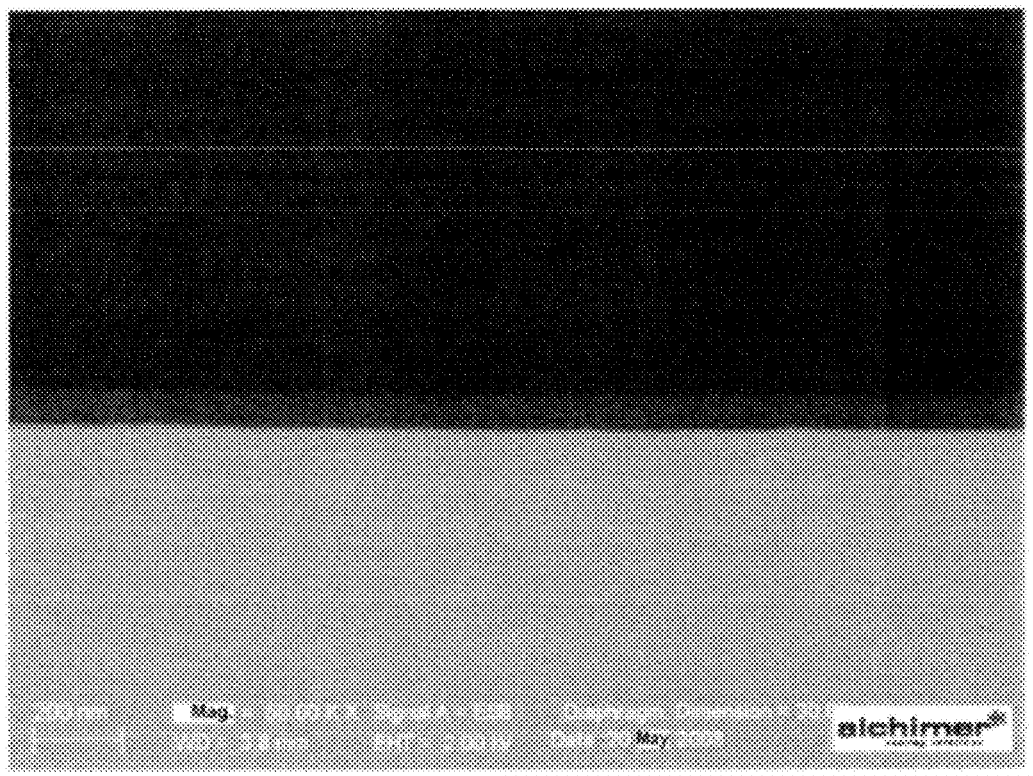

FIG. 4: Scanning electron microscope image of a P4VP film on p-doped Si obtained in Example 2.

Figure 5:
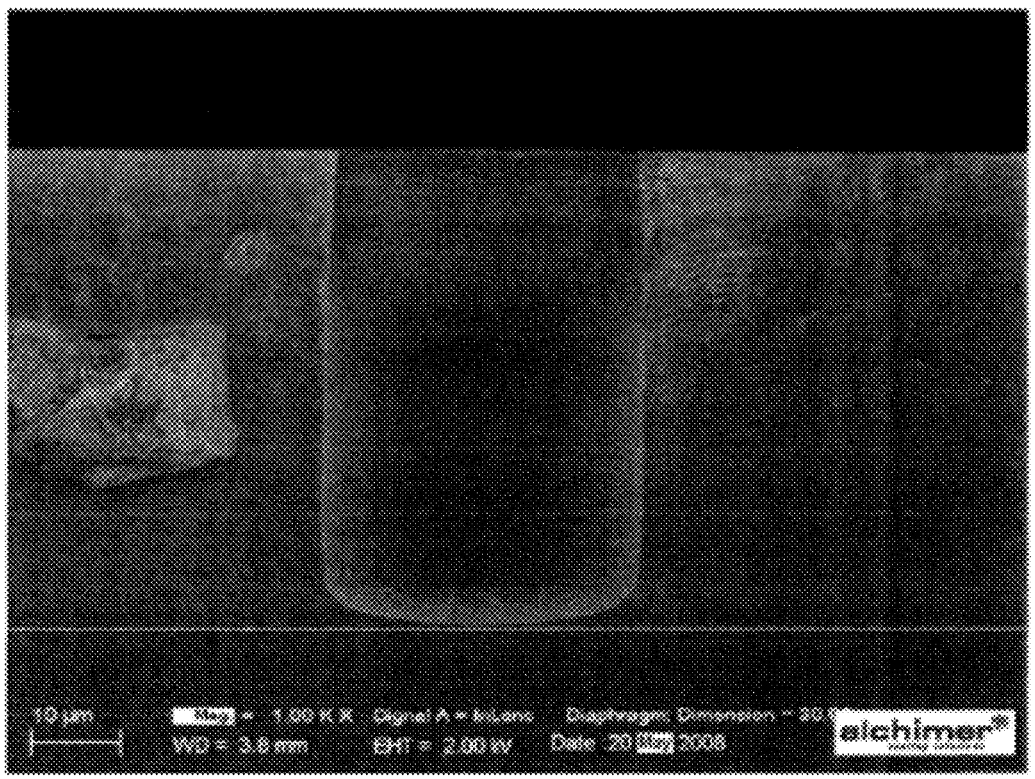
Figure 5:
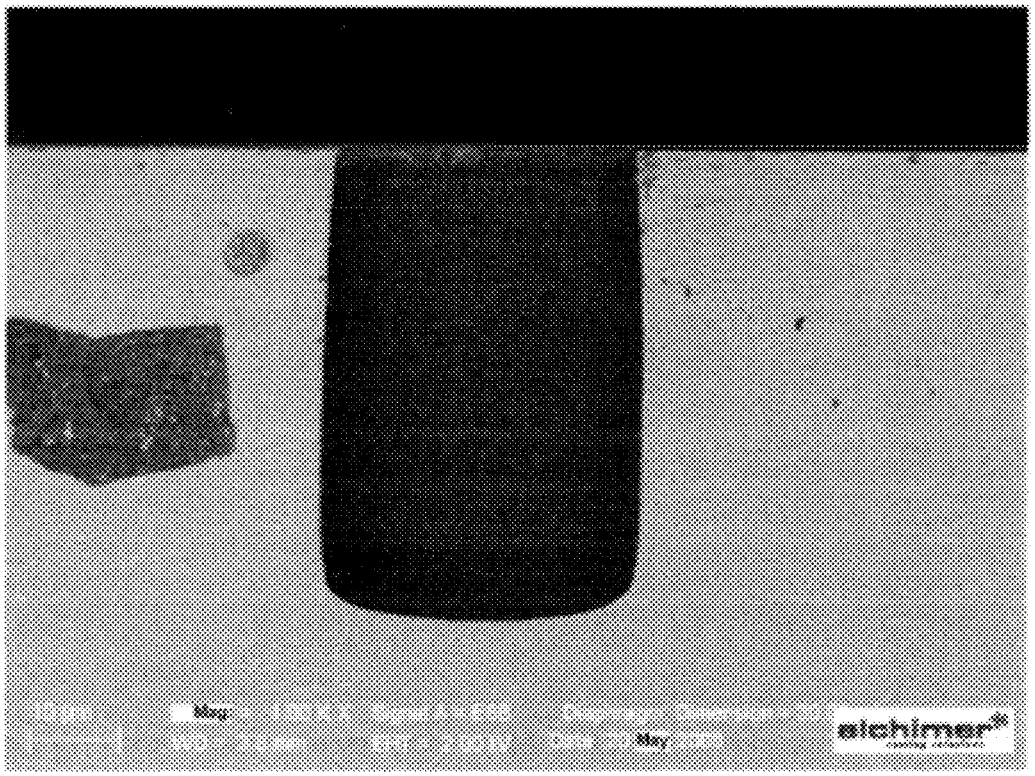

FIG. 5: Scanning electron microscope image of a P4VP film in 30×60 μm vias cut in p-doped silicon and obtained in Example 3.

Figure 6:
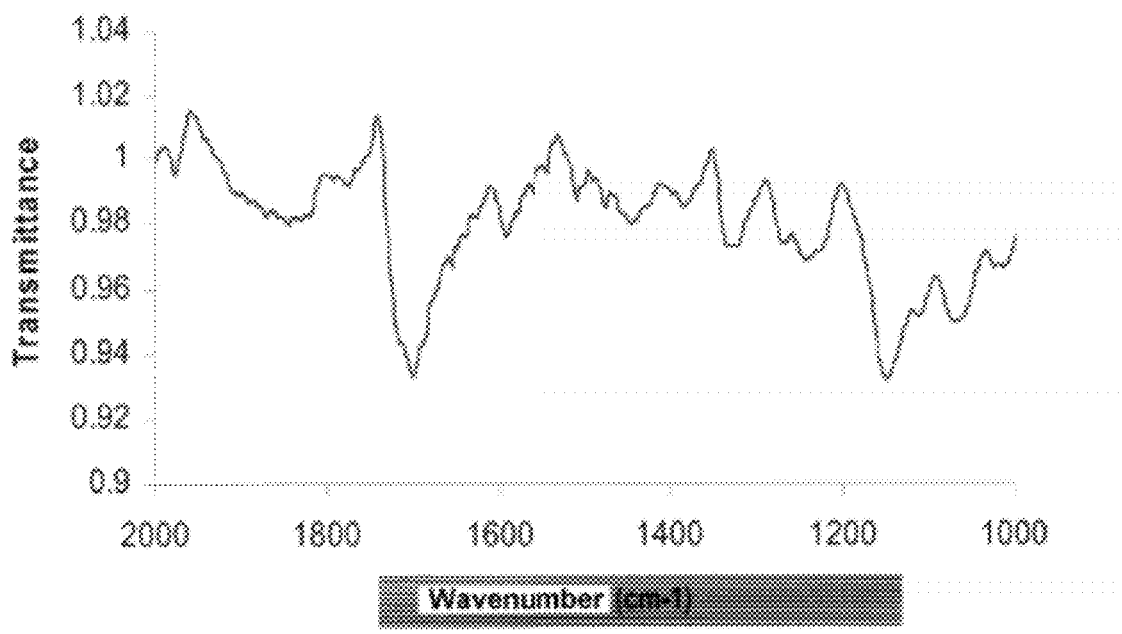

FIG. 6: Infrared ATR-IR spectrum of a PHEMA film on n-doped Si obtained in Example 4.

Figure 7:
Figure 7:
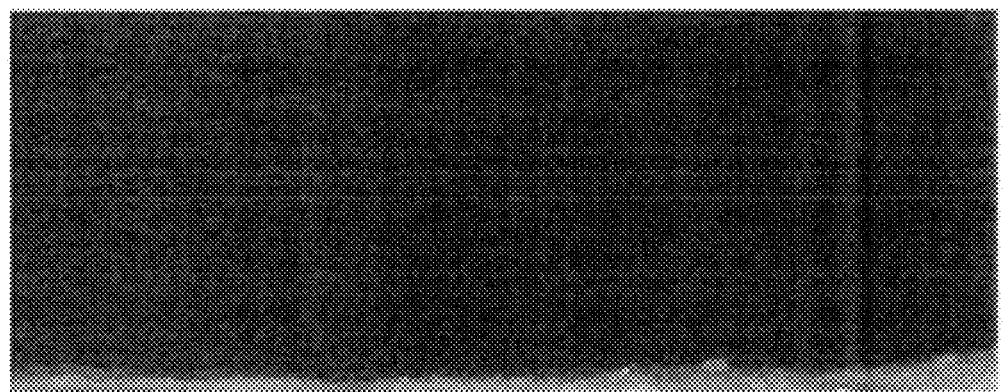

FIG. 7: Scanning electron microscope image of a PHEMA film on n-doped Si obtained in Example 4.

Figure 8:
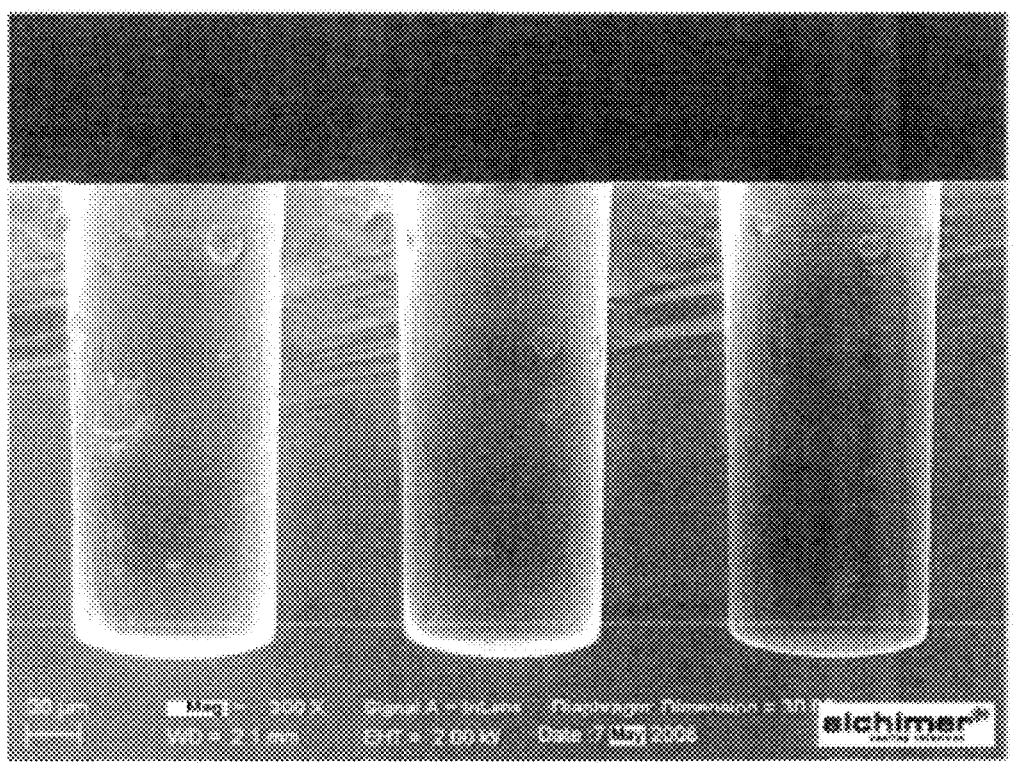
Figure 8:
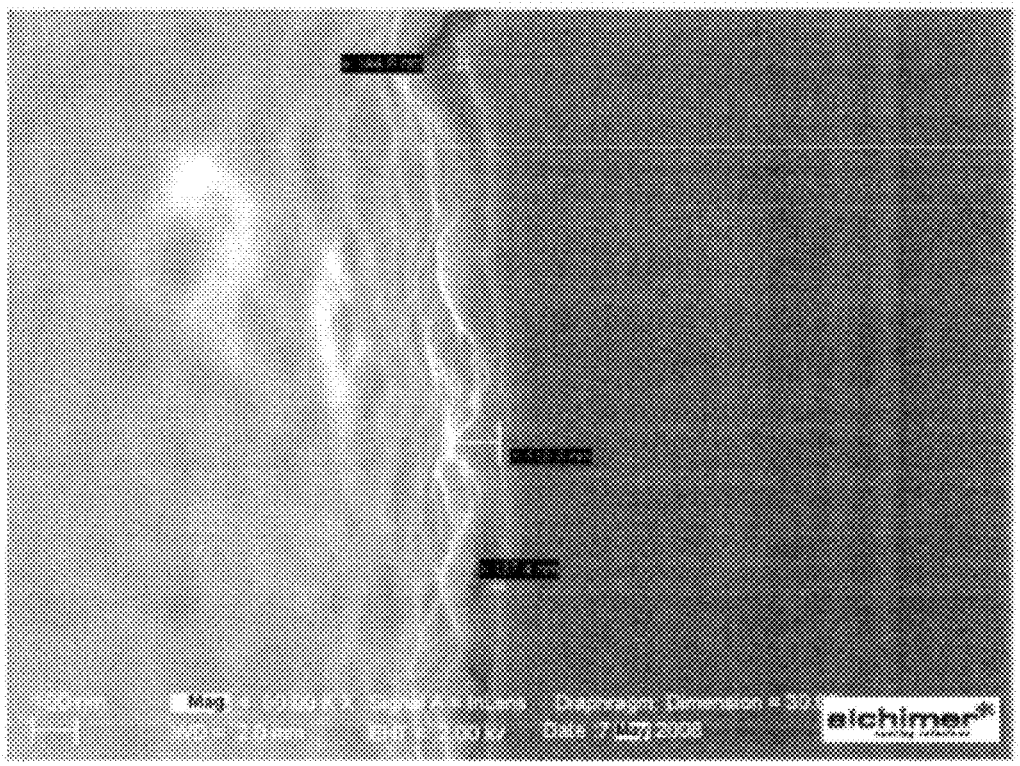

FIG. 8: Scanning electron microscope image of a PHEMA film in 75×200 μm vias cut in $p^+$-doped silicon obtained in Example 6.

Figure 9:
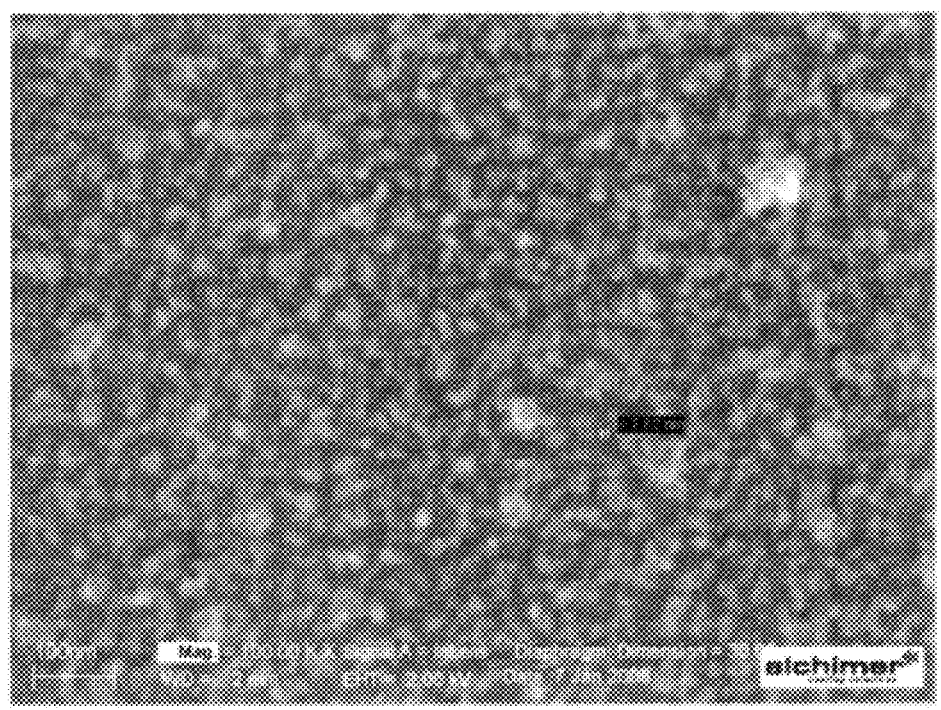

FIG. 9: Scanning electron microscope image of a P4VP film on which a PAA layer and metal nanoparticles obtained in Example 7, 2nd step, have been deposited.

Figure 10:
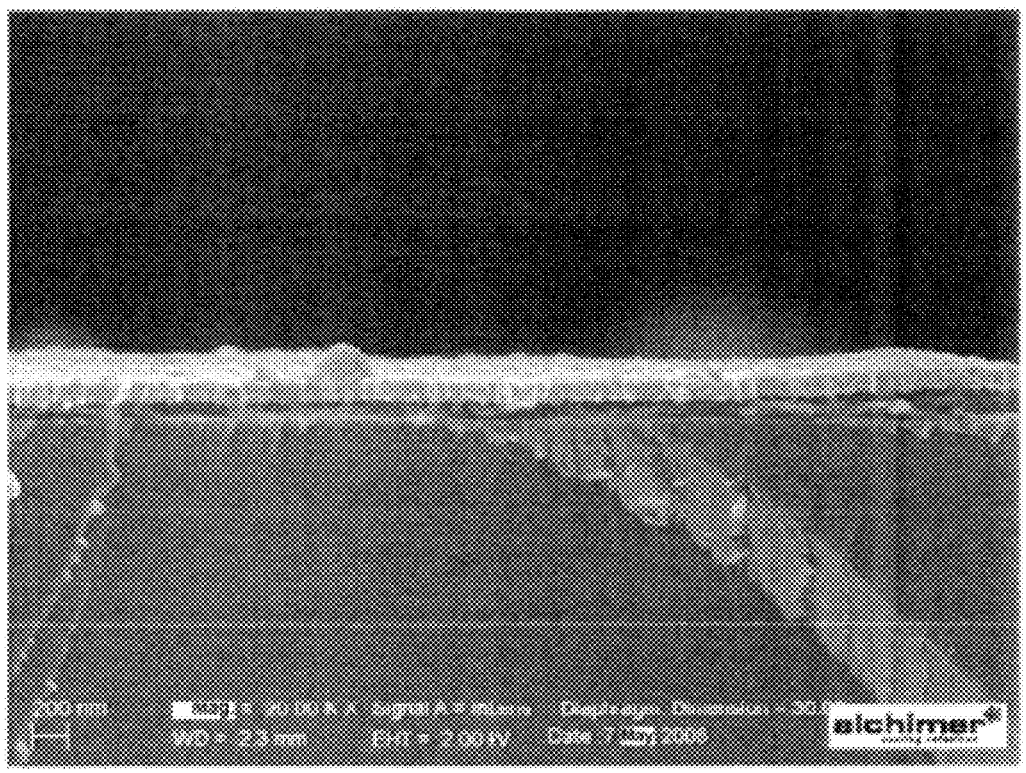
Figure 10:
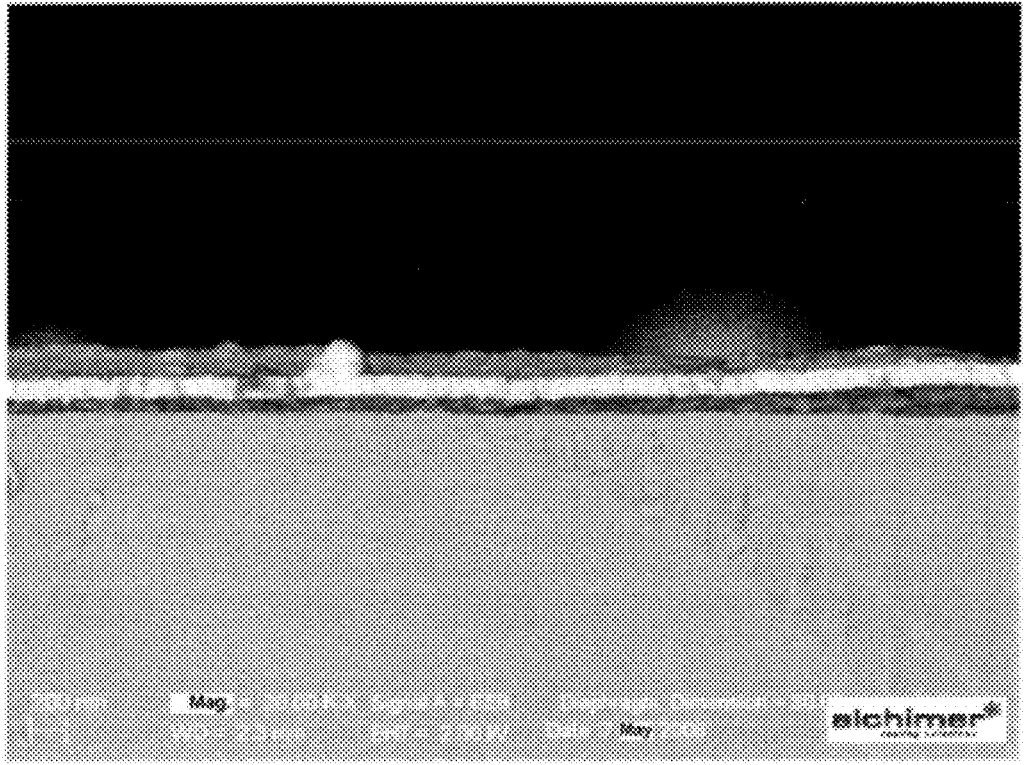

FIG. 10: Scanning electron microscope image of a P4VP-PAA-NiB stack on n-doped Si obtained in Example 7, 3rd step.

Figure 11:
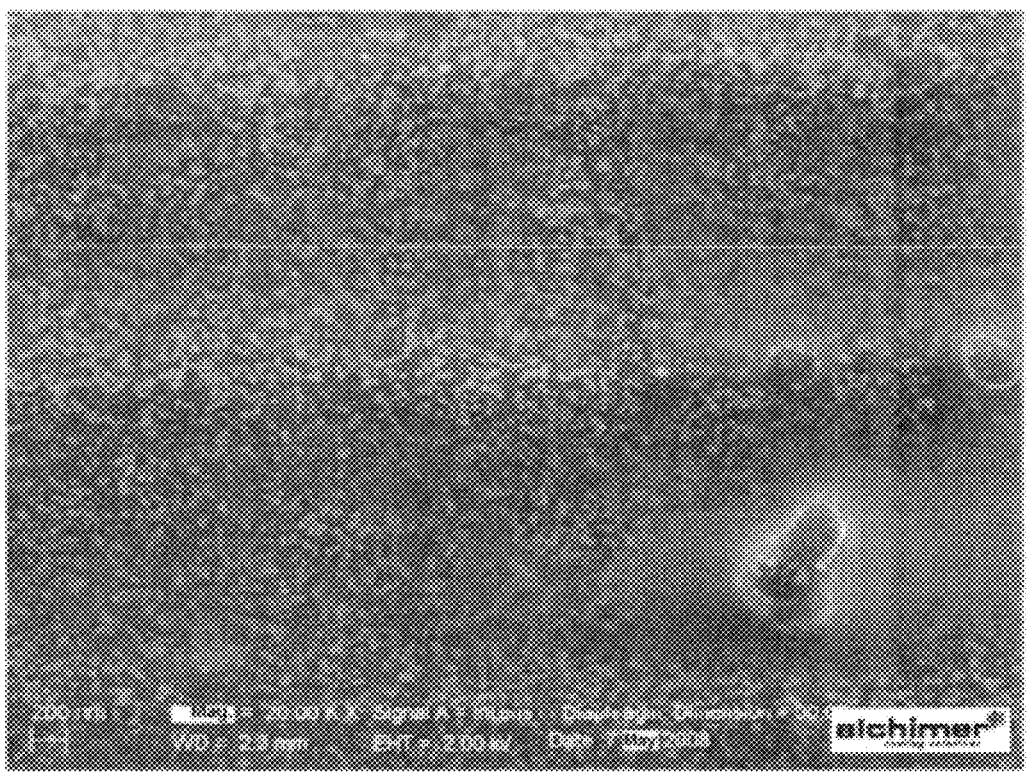
Figure 11:
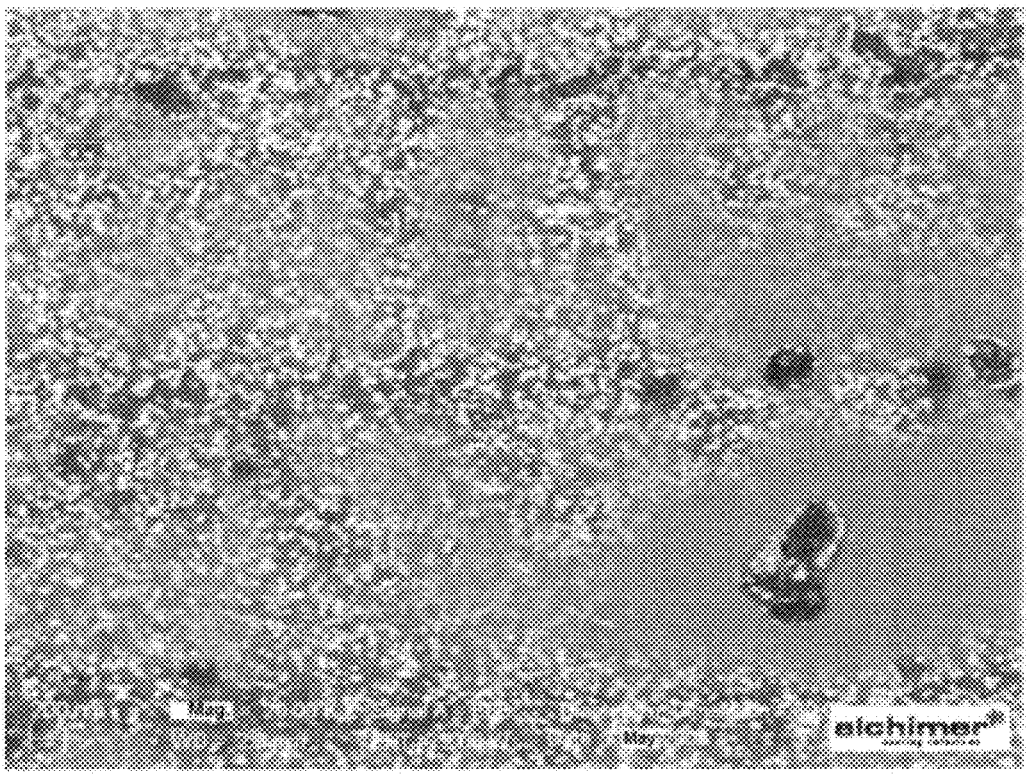

FIG. 11: Scanning electron microscope image of an electrografted PHEMA film onto which a PHEMA layer and metal nanoparticles obtained in Example 8, 2nd step, have been deposited.

Figure 12:
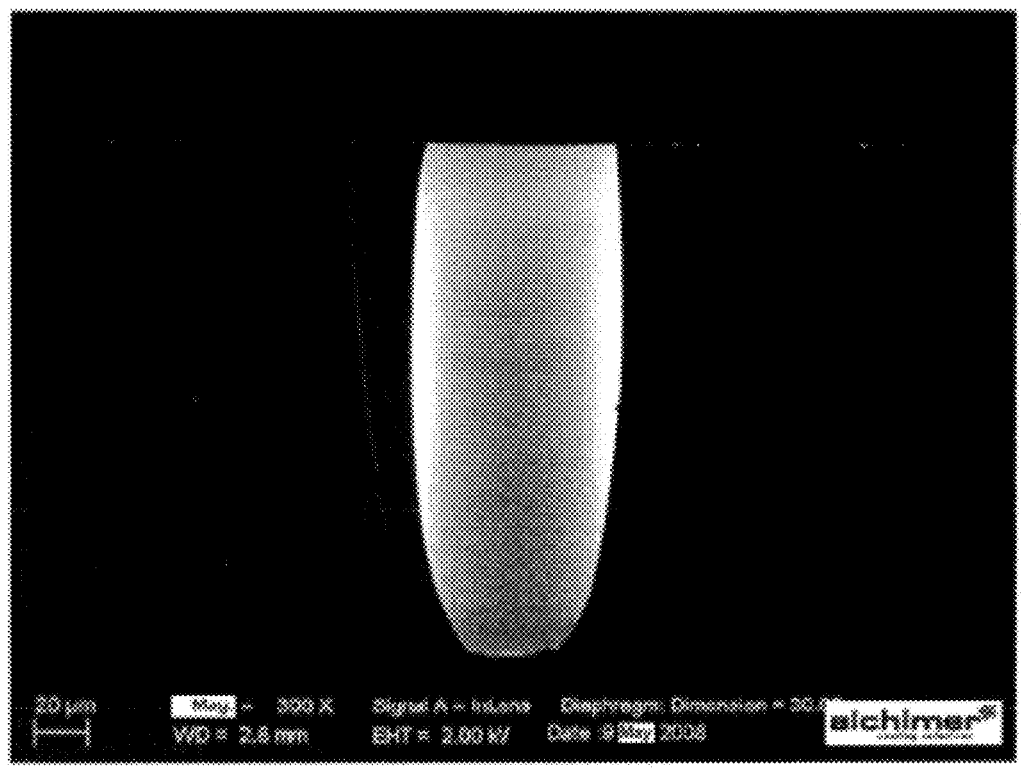
Figure 12:
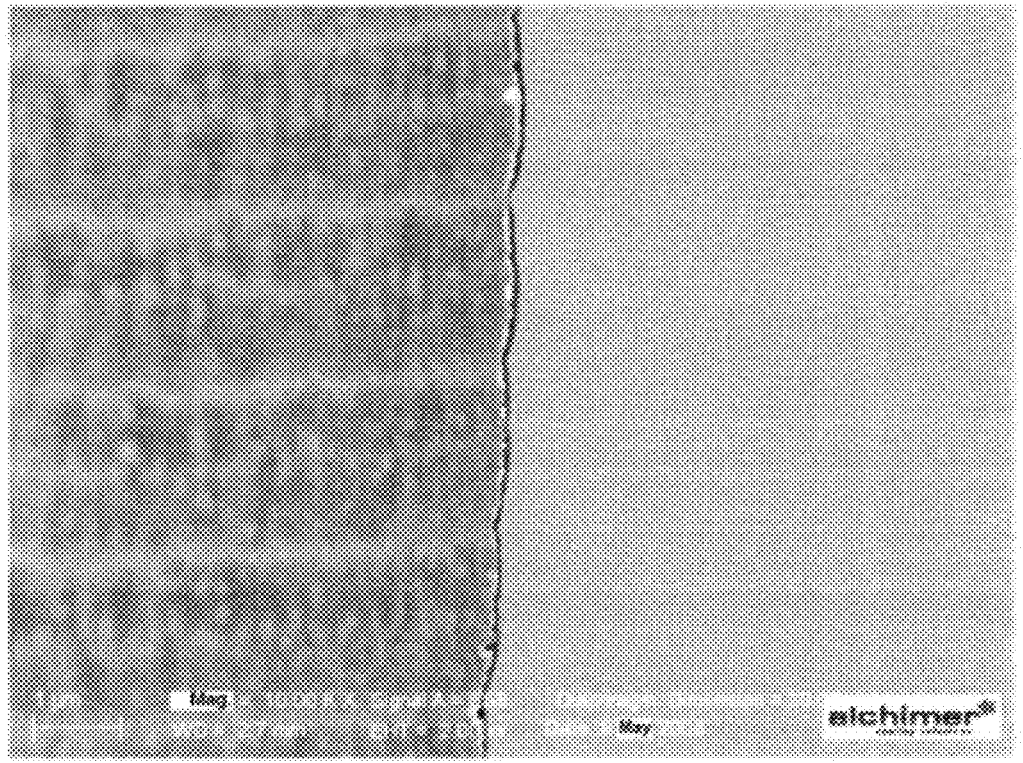

FIG. 12: Scanning electron microscope image of a PHEMA-PHEMA-NIB stack in 75×200 μm vias cut in $p^+$-doped silicon obtained in Example 8, 3rd step.

Figure 13:
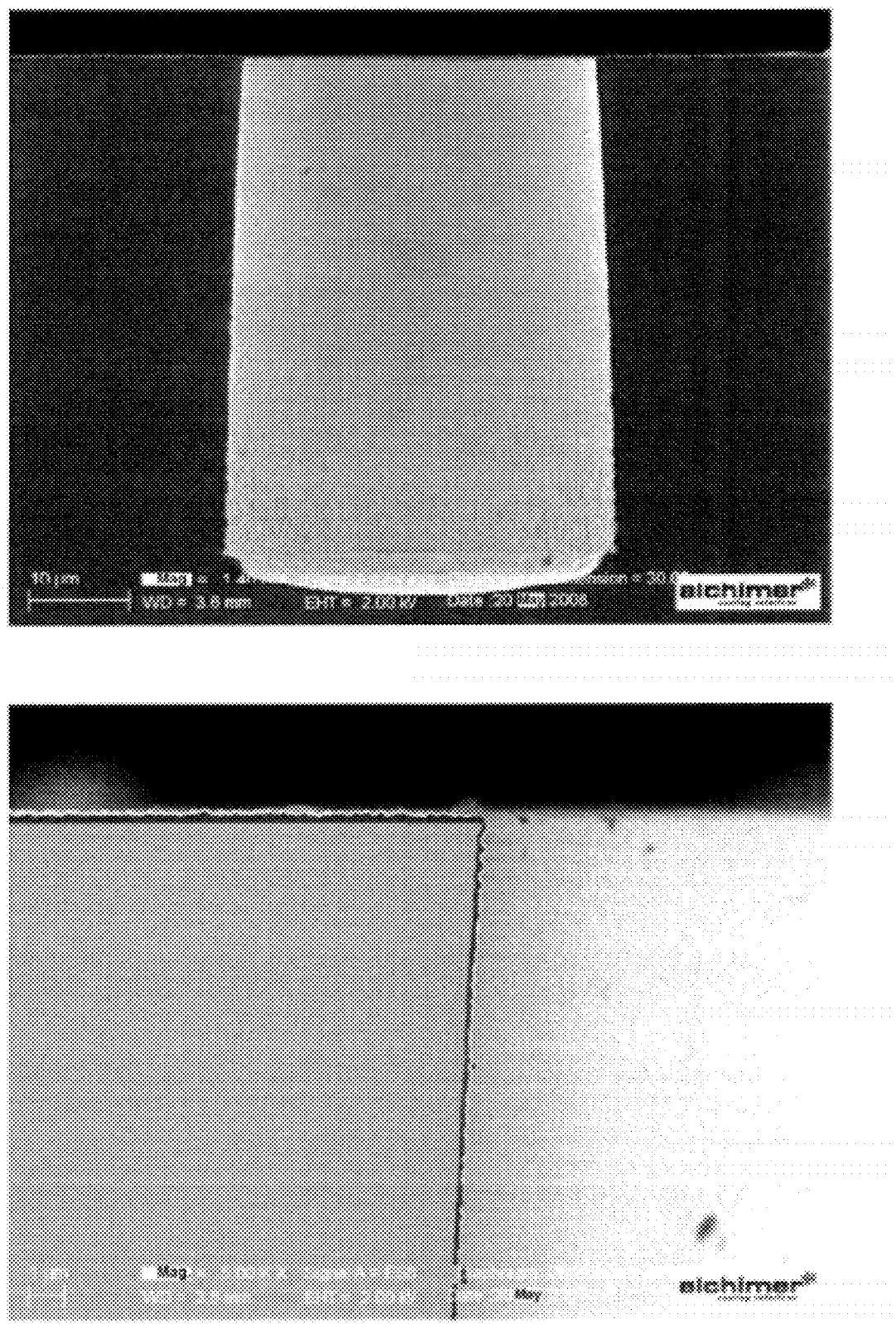

FIG. 13: Scanning electron microscope image of a P4VP-PHEMA-NiB stack in 30×60 μm vias cut in p-doped silicon obtained in Example 9.

Figure 14:
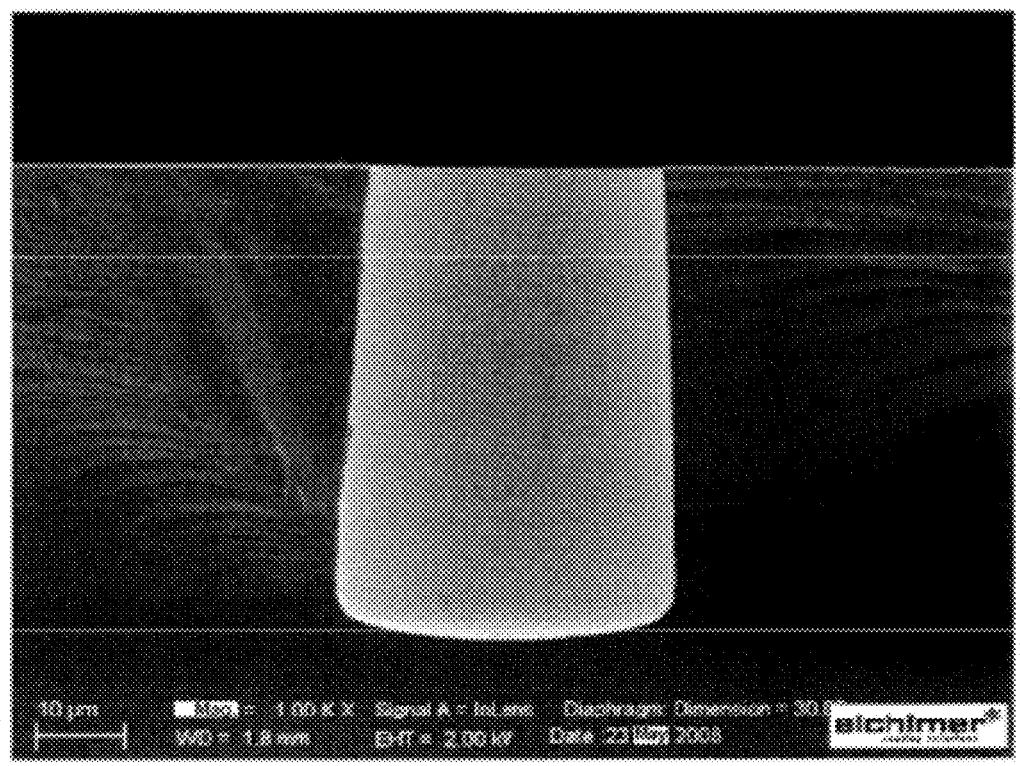
Figure 14:
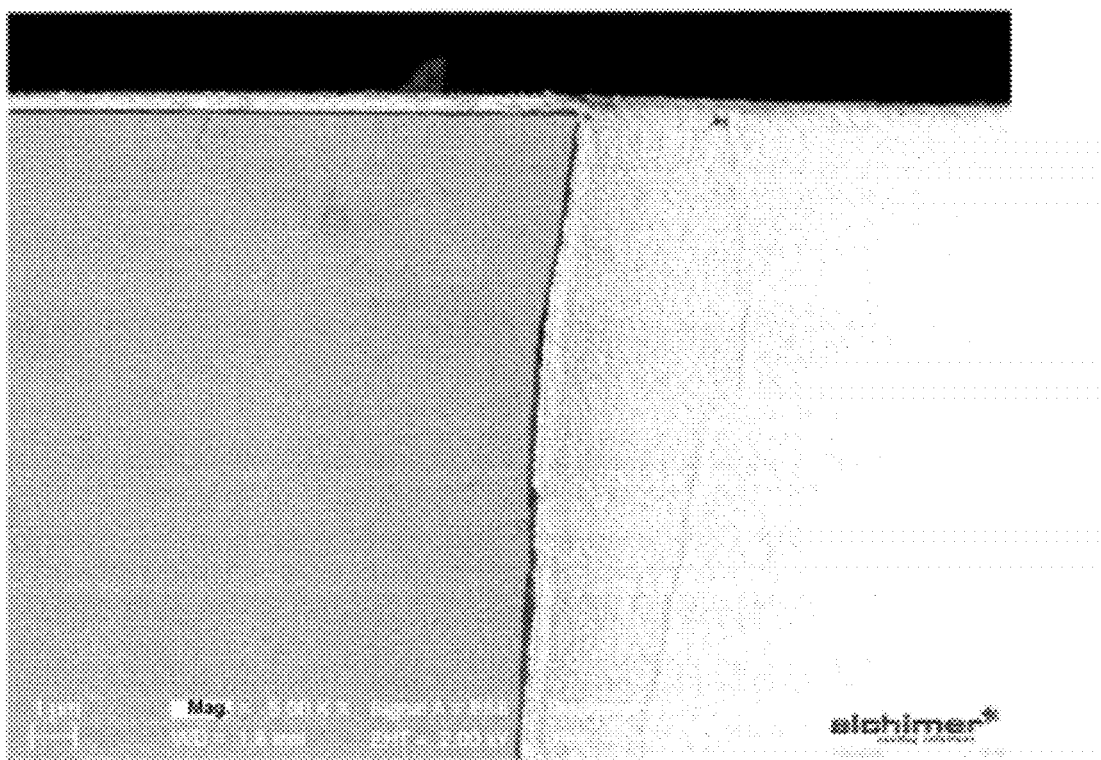

FIG. 14: Scanning electron microscope image of a P4VP-PHEMA-NiB—Cu stack in 30×60 μm vias cut in p-doped silicon obtained in Example 10.

Figure 15:
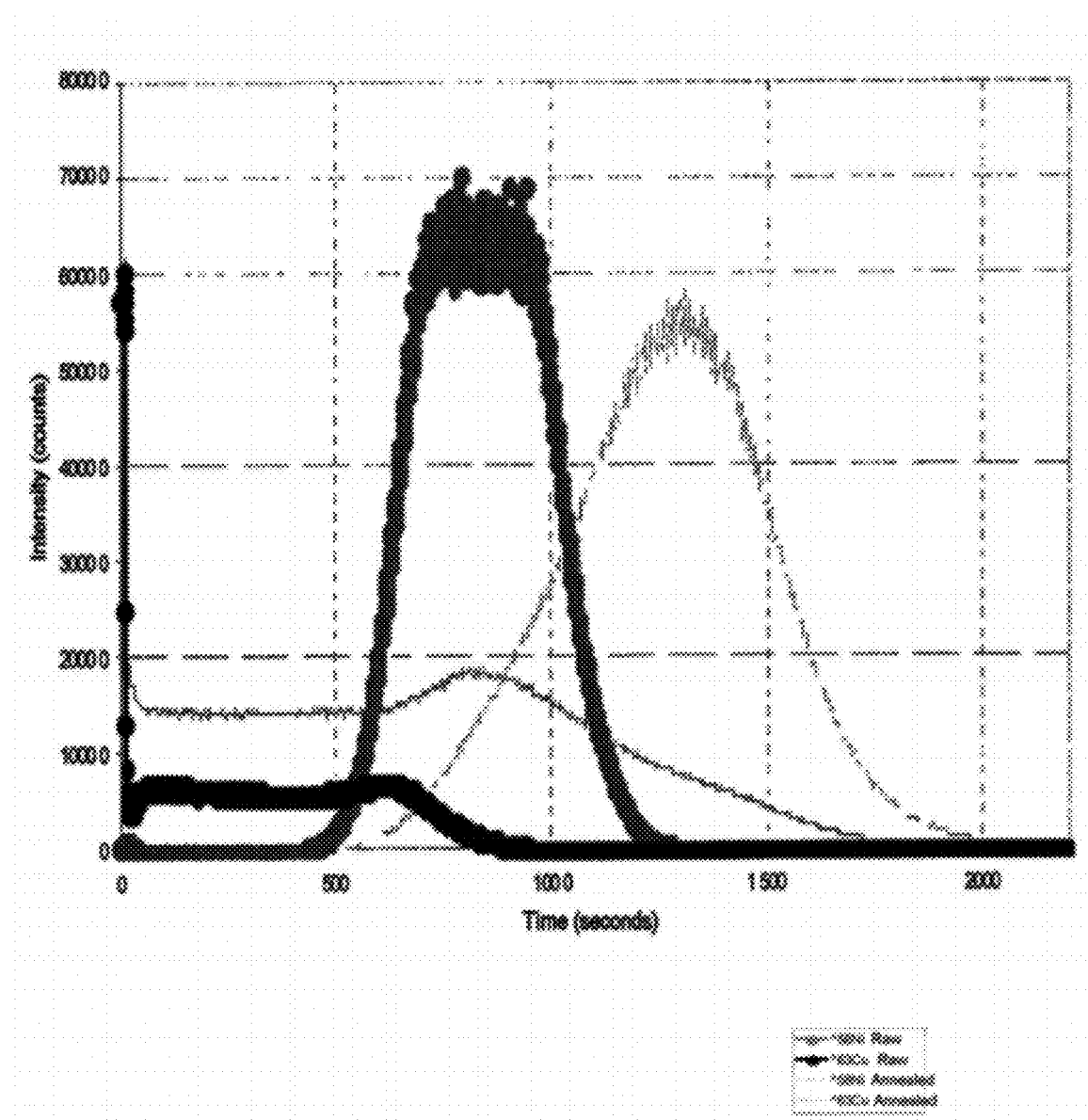

FIG. 15: Tof-SIMS depth profile produced on a P4VP-PHEMA-NiB—Cu stack obtained in Example 10, before annealing (raw sample) and after annealing at 400° C. for 2 hours in inert gas.

Figure 16:
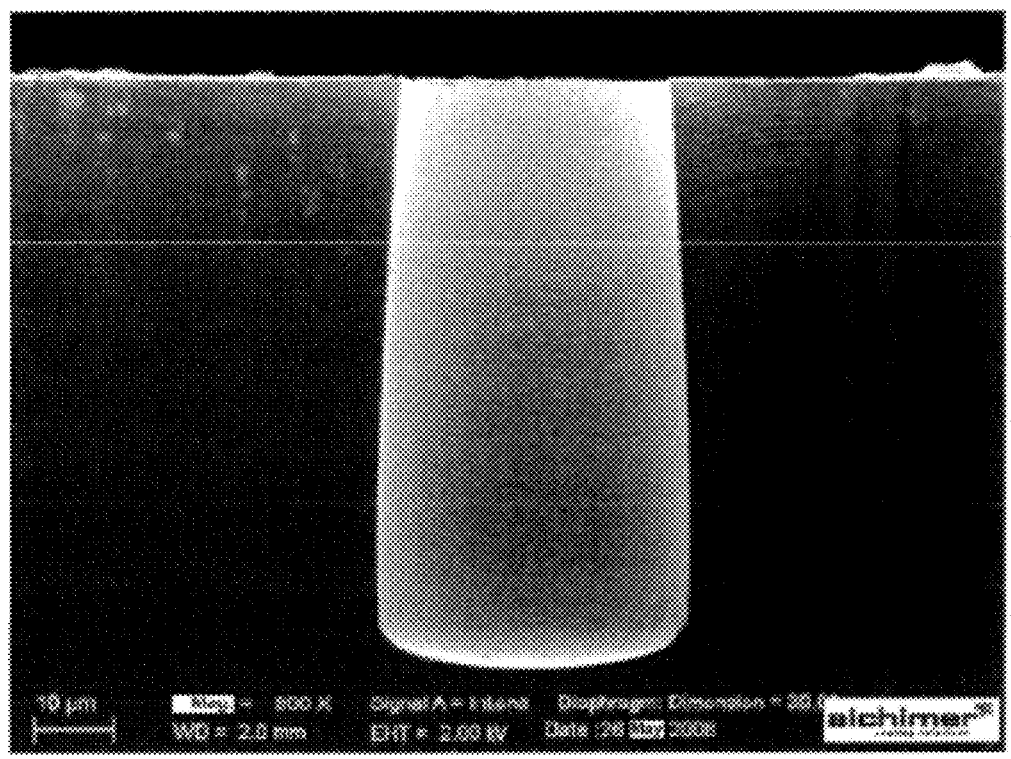
Figure 16:
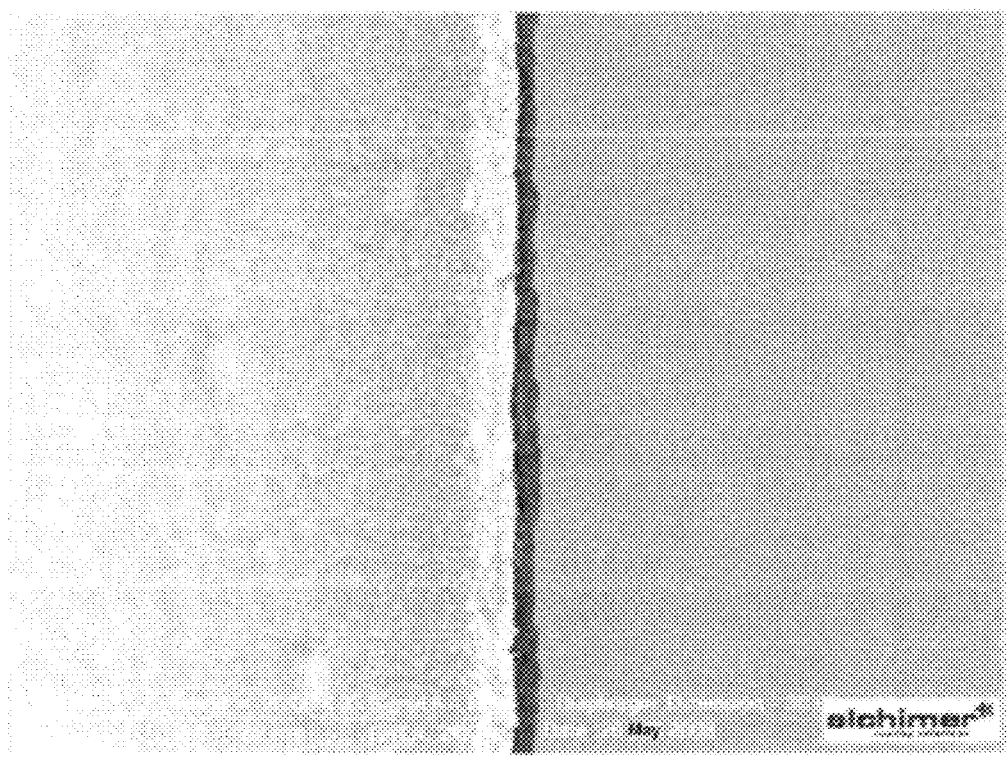

FIG. 16: Scanning electron microscope image of a P4VP-PHEMA-NiB—Cu stack in 30×90 μm vias cut in p-doped silicon obtained in Example 11.

The following examples have been produced at laboratory scale.

Unless indicated to the contrary, these examples have been produced in normal temperature and pressure conditions (around 25° C. at around 1 atm) in ambient air, and the reactants used have been directly obtained commercially without additional purification.

The substrates used have a surface to be coated generally consisting of silicon, optionally doped with various elements (m, p, $p^+$) in various percentages.

In some cases, and more specifically with some p-doped substrates, the silicon surfaces are advantageously subjected to a preliminary treatment consisting in an immersion in a piranha solution ($H_2SO_4:H_2O_2$ 5:1 v/v) followed by an immersion in a hydrofluoric acid solution (10% v/v).

The silicon substrates used in these examples had resistivity values of between 1 and 100Ω·cm.

Example 1

Preparation of a poly-4-vinylpyridine (P4VP) Film on a Planar N-Doped Silicon Substrate Substrate:
The substrate used in this example is a coupon of n-doped silicon with 4 cm sides (4×4 cm) and of 750 μm depth with a resistivity of 20Ω·cm.

Solution:
The electrografting solution employed in this example is an aqueous solution prepared by introducing 5 ml of 4-vinylpyridine (4-VP; $4.5×10^{-2}$ mol) into 95 ml of HCl 1M, then adding to the mixture thus constituted 236 mg of 4-nitrobenzenediazonium tetrafluoroborate (DNO2; $1×10^{-3}$ mol).

The solution has been degassed for 10 minutes prior to its use by an argon flow.

Protocol:
To carry out electrografting on the silicon substrate a system has been used which is composed of:
  a sample holder equipped with means for rotating at a predetermined speed and shaped to support the substrate, the assembly thus constituted being intended to serve as the work electrode;
  a carbon sheet intended to serve as the counter-electrode;
  a stabilized electrical power supply and electrical connection device.

The electrografting of the P4VP onto the surface of the silicon substrate has been carried out by applying to the substrate, previously caused to rotate at a speed of 40 to 100 rpm (60 rpm in the example), a "pulsed voltage" electrochemical protocol for a predetermined duration of around 10 to 30 minutes (15 minutes in the example).

FIG. 1 illustrates the electrochemical protocol that has been used, with:
  a total period P of between 0.01 and 2 seconds (0.6 seconds in the example);
  a polarization time $T_{on}$ of between 0.01 and 1 s (0.36 seconds in the example) during which a potential difference of 5 V to 20 V is applied to the surface of the substrate (cathode potential of −17 V in the example); and
  an idle period with zero potential, called $T_{off}$, of a duration of between 0.01 and 1 s (0.24 seconds in the example).

The duration of this electrografting step depends, as will be understood, on the desired thickness of the polymer insulating layer. This duration can easily be determined by those skilled in the art, as the growth of the layer is a function of the potential difference applied.

In the aforementioned conditions, a polymer (P4VP) layer having a thickness of 300 nanometers has been obtained.

Once the electrografting is finished, the sample has been washed several times with water then with dimethylformamide (DMF) before being dried below an argon flow then oven-dried for 2 hours (90° C.). The drying of the sample may also be carried out in an inert atmosphere and at higher temperatures, typically between 100 and 200° C., so as to obtain a material that is as anhydrous as possible.

Characterizations:
The sample thus prepared has been analyzed by infrared spectroscopy and by Time-of-Flight Secondary Ion Mass Spectroscopy (ToF-SIMS).

As the infrared spectrum obtained shows (see FIG. 2), the presence of the adsorption bands at 1580 $cm^{-1}$ (P4VP), 1520 $cm^{-1}$ (diazonium) and 1350 $cm^{-1}$ (diazonium) confirms the presence of the polymer (P4VP) electrografted onto the surface of the silicon.

The characteristic P4VP peaks observed during the ToF-SIMS analysis in positive ions are reported in Table 1.

TABLE 1

Characteristic peaks of P4VP deposit on n-doped Si observed by Time-of-Flight Secondary Ion Mass Spectroscopy (ToF-SIMS) in positive ions

| | Ion | | | | | | |
|---|---|---|---|---|---|---|---|
| | $C_2H_6N$ | $C_5H_5N$ | $C_5H_6N$ | $C_6H_7N$ | $C_7H_8N$ | $C_9H_8N$ | $C_{14}H_{15}N_2$ |
| Ct Mass | 44 | 79 | 80 | 93 | 106 | 130 | 211 |

A scanning electron microscope (SEM) analysis (see FIG. 3) has also made it possible to see the presence of a homogeneous polymer film on the surface of the silicon sample.

The insulating character of the polymer film obtained has been analyzed by C(V) (Capacitance-Voltage) measurement. The results obtained are collected in Table 2.

TABLE 2

Electrical measurements obtained on P4VP and PHEMA films.

| Polymer | Refractive index | Breakdown voltage (MV/cm) | Dielectric constant | Resistivity ($\mu\Omega \cdot cm$) |
|---|---|---|---|---|
| P4VP | 1.5 | 1.66 | 4.95 | $2.6 \cdot 10^{14}$ |
| PHEMA | 0.98 | 1.43 | 1.89 | $4.38 \cdot 10^{13}$ |

The values obtained confirm the strong insulating character of the P4VP coatings thus formed.

Example 2

Preparation of a poly-4-vinylpyridine (P4VP) Film on a Planar P-Doped Silicon Substrate Substrate:
The substrate used in this example is a coupon of p-doped silicon with 4 cm sides (4×4 cm) and of 750 μm depth with a resistivity of 20Ω·cm.
Solution:
Identical to that used in Example 1.
Protocol:
The experimental protocol is identical to that described in Example 1, with the additional use of a light source (halogen lamp, 150 W) placed in front of the sample of p-doped silicon so as to obtain maximum light intensity on the surface of the sample. To do this, the lamp is placed at a distance of around 10 cm from the surface of the sample. The sample is illuminated throughout the duration of the experiment.
The pulsed electrochemical protocol described in Example 1 is used while applying a potential difference of 1 V to 10 V (cathode potential −3 V in the example).
Characterizations:
A scanning electron microscope (SEM) analysis (see FIG. 4) makes it possible to see the presence of a homogeneous polymer film on the surface of the p-doped silicon sample.

Example 3

Preparation of a poly-4-vinylpyridine (P4VP) Film on a P-Doped Silicon Surface of Through-Vias Substrate:
The substrate used in this example consists of a wafer of silicon with 4 cm sides (4×4 cm) and of 750 μm depth with a resistivity of between 3Ω·cm and 26Ω·cm, etched with cylindrical patterns of the "through-via" of 60 μm depth and 30 μm diameter.
Solution:
Identical to that used in Example 1.
Protocol:
To begin with, the sample is placed in the electrografting solution under ultrasound for 30 seconds so as to enable the vias to be properly filled.
The protocol is then identical to that described in Example 2.
Characterizations:
A scanning electron microscope (SEM) analysis made it possible to demonstrate the covering of the vias. FIG. 5 makes it possible to see the complete covering of a via by the electrografted P4VP film.
The film obtained has good conformity. The percentage conformity of the deposit is calculated by finding the ratio of the thickness of the electrografted layer on the vertical surfaces (profile or side) of the via to that on the horizontal surfaces on top of the via. The thickness on the vertical surfaces is measured at a given depth of the via (4 μm above the base of the via). The percentage conformity obtained in these conditions is close to 50%.

Example 4

Preparation of a poly-2-hydroxyethyl Methacrylate (PHEMA) Film on a Planar N-Doped Silicon Substrate Substrate:
Identical to that used in Example 1.
Solution:
The electrografting solution employed in this example is an aqueous solution prepared by adding 30 ml of 2-hydroxyethyl methacrylate (HEMA, 0.24 mol) into 70 ml of 0.1 N $H_2SO_4$, then by adding to the mixture thus constituted 236 mg of 4-nitrobenzenediazonium tetrafluoroborate ($DNO_2$, $1\times10^{-3}$ mol).
The solution has been degassed for 10 minutes by a stream of argon prior to its use.
Protocol:
Identical to that described in Example 1, a cathode potential of −20 V having been applied in the example.
Characterizations:
The sample obtained has been analyzed by infrared spectroscopy and the infrared spectrum obtained (FIG. 6) shows the presence of adsorption bands at 1720 $cm^{-1}$ (PHEMA), 1520 $cm^{-1}$ (diazonium) and 1350 $cm^{-1}$ (diazonium) which confirms the presence of the electrografted polymer film on the surface of the silicon sample.

A scanning electron microscope (SEM) analysis (see FIG. 7) has also made it possible to see the presence of a homogeneous polymer film on the surface of the silicon sample.

The electrical measurements carried out on the PHEMA film are reported in the preceding Table 2. The values obtained confirm the strongly insulating character of the PHEMA coatings thus formed.

Example 5

Preparation of a poly-2-hydroxyethyl Methacrylate (PHEMA) Film on a Planar P-Doped Silicon Substrate Substrate:
Identical to that used in Example 2.
Solution:
Identical to that used in Example 4.
Protocol:
Identical to that used in Example 2.
Characterizations:
The sample obtained has been analyzed by infrared spectroscopy and the infrared spectrum shows clearly the presence of characteristic bands of the electrografted polymer film on the surface of the silicon.

Example 6

Preparation of a poly-2-hydroxyethyl Methacrylate (PHEMA) Film on a P$^+$-Doped Silicon Surface of Vias Substrate:
The substrate used in this example consists of a wafer of silicon with 4 cm sides (4×4 cm) and of 750 μm depth with a resistivity of between 8 mΩ·cm and 20 mΩ·cm, etched with cylindrical patterns of the "through-via" of 200 μm depth and 75 μm diameter.

Solution:
Identical to that used in Example 4.
Protocol:
Identical to that used in Example 2.
Characterizations:
The sample obtained has been analyzed by infrared spectroscopy and the infrared spectrum confirms the presence of the electrografted polymer (PHEMA) on the surface of the silicon sample.

A scanning electron microscope (SEM) analysis (see FIG. 8) made it possible to see the presence of a homogeneous polymer film covering the entire surface of the via. The conformity percentage for the deposit, as measured in Example 3, is 40%.

Example 7

Production of a P4VP-PAA-NiB Insulator/Barrier Stack on a Planar N-Doped Silicon Substrate Substrate:
Identical to that used in Example 1.
Insulation:
Produced according to Example 1.
Diffusion Barrier:
A nickel-boron (NiB) barrier is deposited in three steps onto the poly-4-vinylpyridine (P4VP) surface obtained at the end of Example 1.

Step 1: Formation of a Polymeric Tie Layer of the Polyacid Type:

Solution:
The solution employed in this example is an aqueous solution of polyacrylic acid (PAA, MW 450000, 1 g·l$^{-1}$).
Protocol:
The substrate coated with a P4VP film obtained in Example 1 is immersed for 10 minutes in a beaker containing the aqueous solution of polyacrylic acid. The sample is then washed several times using distilled water, then dried under a stream of argon.
Characterizations:
The sample thus obtained has been analyzed by Time-of-Flight Secondary Ion Mass Spectroscopy (ToF-SIMS). The ToF-SIMS analysis, the results of which are reported in Table 3, has made it possible to demonstrate the characteristic PAA peaks.

TABLE 3

Characteristic PAA peaks on an SiN/P4VP/PAA stack observed by Time-of-Flight Secondary Ion Mass Spectroscopy (ToF-SIMS) in negative ions.

| | Ion | | | | | | |
|---|---|---|---|---|---|---|---|
| | $C_2H_3O_2$ | $C_3H_3O_3$ | $C_6H_7O_2$ | $C_6H_9O_2$ | $CH_7O_4$ | $C_9H_8N$ | $C_{10}H_{15}O_5$ |
| Ct Mass | 51 | 71 | 111 | 113 | 143 | 130 | 215 |

Step 2: Incorporation of Nanoparticles of NiB:
Solution:
A colloidal suspension of NiB nanoparticles was prepared at 20° C. To this end, 120 mg of a metal precursor NiSO$_4$ (4.5×10$^{-4}$ mol) were dissolved in 50 ml of deionized water, then 1.8 g of cetyl trimethylammonium bromide (CTAB, 4.7×10$^{-3}$ mol) stabilizer was added. 80 mg of sodium borohydride (NaBH$_4$, 2×10$^{-3}$ mol) dissolved in 2 ml of deionized water were then added, in a single injection, to this solution. The solution instantly changed colour to become the intense black characteristic of the zero metal present in colloidal form.
Protocol:
The substrate with a surface coated with a P4VP-PAA polymer bilayer prepared in the preceding step was introduced into the colloidal NiB solution. The sample was kept in this solution for several minutes, for example between 1 and 15 minutes, then washed in deionized water for around 1 minute before being dried under a stream of argon.
Characterizations:
A scanning electron microscope (SEM) analysis (see FIG. 9) made it possible to see the distribution of NiB nanoparticles on the surface of the polymer.

Step 3: Formation of a Nickel Layer by Electroless Deposition:

Solution:

The solution employed in this example was prepared by introducing into a Pyrex beaker 50 ml of deionized water, 1.41 g of $NiSO_4$ ($5.4 \times 10^{-3}$ mol), 3 g of tribasic sodium citrate ($1 \times 10^{-2}$ mol) or 2 g of citric acid ($1 \times 10^{-2}$ mol) and 141 mg of dimethylamino borane (DMAB, $2 \times 10^{-3}$ mol). The pH of the solution was adjusted to 9 by adding a sodium hydroxide solution NaOH or TMAH.

Protocol:

The solution was heated to 60° C., then the sample prepared in the preceding step was introduced into the medium for several minutes, for example between 2 and 10 minutes. The substrate was then removed then washed in deionized water and dried under a stream of argon.

Characterizations:

The surface thus processed is characterized by a uniform metallic (mirror) appearance. Depending on the metallization time, the thicknesses of metal obtained may vary between a few nanometers and several hundreds of nanometers.

A scanning electron microscope (SEM) analysis (see FIG. 10) made it possible to demonstrate the formation of a continuous NiB metal film over the entire surface.

Example 8

Production of a PHEMA-PHEMA-NiB Insulator/Barrier Stack on a $P^+$-Doped Silicon Surface of Vias Substrate:
Identical to that used in Example 6.
Insulation:
Produced according to Example 6.
Diffusion Barrier:
A nickel-boron (NiB) barrier was deposited in three steps onto the poly-2-hydroxyethyl methacrylate (PHEMA) surface obtained at the end of Example 6.

Step 1: Formation of a Tie Layer Formed from an Adhesion Primer

This layer was produced by following the general teaching of the publication Mévellec et al., *Chem. Mater.*, 2007, 19, 6323-6330:

Solution:

The solution employed in this example is an aqueous solution of adhesion primer. To develop it, the following solutions are prepared first:
  1.08 g ($1 \times 10^{-2}$ mol) of p-aminoaniline in 100 ml of HCl 0.5M (solution A).
  690 mg ($1 \times 10^{-2}$ mol) of $NaNO_2$ in 100 ml of deionized water (solution B).
25 ml of solution B are slowly added to 25 ml of solution A. To this mixture 5 ml of 2-hydroxyethyl methacrylate (HEMA, $4 \times 10^{-2}$ mol) are then added, then the reaction is initiated by adding 1 g of iron powder at 99% ($1.7 \times 10^{-2}$ mol) or 16 ml of commercial hypophosphorous acid at 50% by mass in water, acting as a reducing agent.

Protocol:

The silicon substrate functionalized by the PHEMA obtained in Example 6 was immersed in the solution for a duration of between 1 and 20 minutes before being washed (DMF, water), then dried under a stream of nitrogen.

Step 2: Incorporation of NiB Nanoparticles:

Solution:
Identical to that used in Example 7, Step 2.
Protocol:
Identical to that used in Example 7, Step 2.
Characterizations:
A scanning electron microscope (SEM) analysis (see FIG. 11) made it possible to see the distribution of NiB nanoparticles on the surface of the polymer.

Step 3: Formation of a Nickel Layer by Electroless Deposition:

Solution:
Identical to that used in Example 7, Step 3.
Protocol:
Identical to that used in Example 7, Step 3.
Characterizations:
The surface thus processed is characterized by a uniform metallic (mirror) appearance. Depending on the metallization time, the thicknesses of metal obtained may vary between a few nanometers and several hundreds of nanometers.

A scanning electron microscope (SEM) analysis (see FIG. 12) made it possible to demonstrate the formation of a continuous NiB metal film over the entire surface. The conformity percentage of the NiB deposit, as measured in Example 3, is 50%.

Example 9

Production of a P4VP-PHEMA-NiB Insulator/Barrier Stack on a P-Doped Silicon Surface of Vias Substrate:
Identical to that used in Example 3.
Insulation:
Produced according to Example 3.
Diffusion Barrier:
Produced according to Example 8.
A scanning electron microscope (SEM) analysis made it possible to demonstrate the insulator/barrier stack over the entire surface of the via (see FIG. 13). The conformity percentage of the deposit, as measured in Example 3, is 65%.

Example 10

Production of a P4VP-PHEMA-NiB—Cu Insulator/Barrier/Seed Layer Stack on a P-Doped Silicon Surface of Vias Substrate:
Identical to that used in Example 3.
Insulation:
Produced according to Example 3.
Diffusion Barrier:
Produced according to Example 8.
Formation of a Copper Seed Layer:
Solution:
The deposition of a copper seed layer was carried out using an aqueous electrodeposition solution containing 2.1 ml·l$^{-1}$ (32 mM) of ethylenediamine and 4 g·l$^{-1}$ (16 mM) of $CuSO_4 \cdot 5H_2O$.

Protocol:
The electrodeposition method implemented in this example comprises various consecutive steps:
  a "cold entry" step where the substrate is brought into contact by immersion, without electrical power supply, in the electrodeposition solution for a duration of at least one minute (for example 3 minutes);
  a copper growth step where the substrate is cathode polarized in galvano-pulsed mode and simultaneously set in rotation at a speed of 20 to 100 revolutions per minute (for example 40 revolutions per minute). FIG. 1 describes in detail the galvano-pulsed protocol capable of being used, with a total period P of between 10 ms and 2 s (0.6 s in the example), a polarization time $T_{ON}$ of between 2 ms and 1.6 s (0.35 s in the example) while applying a current per unit surface area generally between 0.6 mA·cm$^{-2}$ and 10 mA·cm$^{-2}$ (2.77 mA·cm$^{-2}$ in the example), an idle period $T_{off}$ without polarization of between 2 ms and 1.6 s (0.25 s in the example). The duration of this step depends, as will be understood, on the desired thickness of the seed layer. This duration can easily be determined by those skilled in the art, as the growth of the film is a function of the charge passed into the circuit. In the aforementioned conditions, the rate of deposition is around 1.5 nm per coulomb of charge passed into the circuit, which gives a duration of the electrodeposition step of around 17 minutes in order to obtain a coating having a thickness of 300 nm;

a "hot exit" step where the substrate coated with copper is removed from the electrodeposition solution at a zero rotation speed while being kept polarized under voltage. The duration of this phase is around 2 seconds. The rotation speed is then brought to 500 revolutions per minute for 10 seconds, the cathode polarization being cut in this final phase. The substrate is then washed in deionized water and dried under a stream of nitrogen.

Characterizations:

A scanning electron microscope (SEM) analysis (see FIG. 14) made it possible to demonstrate the three-layer insulator/barrier/copper stack over the entire surface of the via. The conformity percentage of the copper layer, as measured in Example 3, is 60%.

The barrier properties of the NiB layer have been demonstrated by a well-known analytical method (M. Yoshino et al. *Electrochim. Acta*, 2005, 51, 916-920), which consists in tracking the diffusion of copper into the diffusion barrier after annealing through the Tof-SIMS profile.

Comparison of the Tof-SIMS profiles (see FIG. 15) before (raw sample) and after annealing at 400° C. for two hours in a controlled atmosphere shows the absence of copper diffusion in the NiB diffusion barrier.

Example 11

Production of a P4VP-PHEMA-NiB—Cu Insulator/Barrier/Seed Layer Stack on a P-Doped Silicon Surface of Vias Substrate:
The substrate used in this example consists of a wafer of silicon with 4 cm sides (4×4 cm) and of 750 μm depth with a resistivity of between 3Ω·cm and 26Ω·cm, etched with cylindrical patterns of the "through-via" type of 90 μm depth and 30 μm diameter.
Insulation:
Produced according to Example 3.
Diffusion Barrier:
Produced according to Example 8.
Seed Layer:
Produced according to Example 10.

A scanning electron microscope (SEM) analysis (see FIG. 16) made it possible to demonstrate the stacking of the three insulator/barrier/copper layers over the entire surface of the via.

Example 12

Production of a P4VP-NiB Insulator/Barrier Stack on a P-Doped Silicon Surface

Substrate:
Identical to that used in Example 2.
Insulation:
Produced according to Example 2.
Diffusion Barrier:
A nickel-boron (NiB) barrier is deposited in two steps onto the poly-4-vinylpyridine (P4VP) surface obtained at the end of the isolation step described in Example 2.

Step 1: Activation of the poly-4-vinylpyridine with a Palladium Salt
Solution:
The solution employed in this example is an aqueous activating solution containing 2 mg ($1.10^{-5}$ mol) of commercial palladium chloride salt PdCl$_2$ dissolved in 100 ml HCl 0.1M.
Protocol:
The silicon substrate functionalized by the P4VP obtained in Example 2 was immersed in the activating solution for a duration of between 30 seconds and 5 minutes before being washed in deionized water and dried under a stream of nitrogen.

Characterizations:
The surface thus processed is characterized by a uniform metallic (mirror) appearance. Depending on the metallization time, the thickness of the metal obtained may vary between a few nanometers and several hundred nanometers.

Example 13

Production of a P4VP-NiB—Cu Insulator/Barrier/Seed Layer Stack on a P-Doped Silicon Surface of Vias Substrate:
The substrate used in this example consists of a wafer of silicon with 4 cm sides (4×4 cm) and of 750 μm depth with a resistivity of 20Ω·cm, etched with cylindrical patterns of the "through-via" type of 30 μm depth and 5 μm diameter.
Insulation:
Produced according to Example 2.
Diffusion Barrier:
Produced according to Example 12. In order to allow the different solutions to better penetrate the "through-via" type pattern, steps 1 and 2 can be carried out under ultrasound.
Seed Layer:
Produced according to Example 10.
Characterizations:
A scanning electron microscope (SEM) analysis made it possible to demonstrate the stacking of the three insulator/barrier/copper layers over the entire surface of the via. The conformity percentage of the nickel deposit, as measured in Example 3, is 78% and the conformity percentage of the copper deposit, as measured in Example 3, is 60%.

The invention claimed is:
1. A method of preparing an electrically insulating film at the surface of an electrical conductor or semiconductor substrate, comprising:
   a) bringing said surface into contact with a liquid solution comprising:
      a protic solvent;
      at least one diazonium salt;
      at least one monomer that is chain-polymerizable and soluble in said protic solvent; and at least one acid in a sufficient quantity to stabilize said diazonium salt by adjusting the pH of said solution to a value less than 7; and b) polarizing said surface according to a potentio- or galvano-pulsed mode for a duration sufficient to form a film having a thickness of at least 60 nanometers.

2. The method according to claim 1, wherein said substrate is a silicon substrate, wherein said at least one acid is comprised in said liquid solution in a sufficient quantity to stabilize said diazonium salt by adjusting the pH of said solution to a value less than 2.5; and wherein the polarization of said surface is carried out for a duration sufficient to form a film having a thickness of between 80 and 500 nanometers.

3. The method according to claim 1, wherein said protic solvent is at least one selected from the group consisting of water, hydroxylated solvents, and carboxylic acids having 2 to 4 carbon atoms.

4. The method according to claim 1, wherein said protic solvent is at least one selected from the group consisting of deionized water, distilled water, alcohols having 1 to 4 carbon atoms, formic acid, and acetic acid.

5. The method according to claim 1, wherein said diazonium salt is an aryldiazonium salt selected from the group consisting of the compounds of formula (I):

in which:
A⁻ represents a monovalent anion,
R represents an aryl group.

6. The method according to claim 1, wherein said chain-polymerizable monomer is selected from the group consisting of vinyl monomers chosen from the monomers of formula (II):

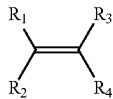

in which $R_1$ to $R_4$ are identical to or different from one another, and each of $R_1$ to $R_4$ represents a monovalent non-metal atom, a saturated or unsaturated chemical group, a —$COOR_5$ group in which $R_5$ represents a hydrogen atom or a $C_1$-$C_6$ alkyl, nitrile, carbonyl, amine or amide group.

7. The method according to claim 5, wherein said chain-polymerizable monomer is soluble in the protic solvent and is selected from the group consisting of vinyl monomers chosen from the monomers of formula (II):

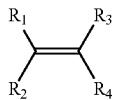

in which $R_1$ to $R_4$ are identical to or different from one another, and each of $R_1$ to $R_4$ represents one of the following:
a halogen atom,
a hydrogen atom,
a saturated or unsaturated $C_1$-$C_6$ alkyl,
a saturated or unsaturated aryl,
a —$COOR_5$ group in which $R_5$ represents a hydrogen atom or a $C_1$-$C_6$ alkyl,
a nitrile group,
a carbonyl group,
an amine group, and
an amide group.

8. The method according to claim 1, wherein said liquid solution comprises:
at least 0.3M of polymerizable monomer(s), and
at least $5 \times 10^{-3}$M of diazonium salt(s),
the molar ratio of the polymerizable monomer(s) to the diazonium salt(s) being between 10 and 300.

9. The method according to claim 1, wherein the polarization of said surface is produced in a pulsed mode, each cycle being characterized by:
a total period P of between 10 ms and 2 s;
a polarization time $T_{on}$ of between 0.01 and 1 s, during which a potential difference or a current is applied to the surface of the substrate; and
an idle period with zero potential or current of a duration of between 0.01 and 1 s.

10. The method according to claim 7, wherein the polarization of said surface is produced in a pulsed mode, each cycle of the pulsed mode being characterized by:
a total period P of around 0.6 s;
a polarization time $T_{on}$ of around 0.36 s, during which a potential difference or a current is applied to the surface of the substrate; and
an idle period with zero potential or current of a duration of around 0.24 s.

11. A method of preparing a coating of an electrical conductor or semiconductor substrate, said coating comprising an internal layer forming an electrically insulating film and an external layer forming a copper diffusion barrier, wherein:
A. said internal layer is produced by employing the method according to claim 1;
B. said external layer is produced by:
a) forming, by using a wet process at the surface of the internal layer thus obtained, an organic film containing particles of metals or metal alloys;
b) bringing the film thus formed into contact with a liquid solution containing at least one metal salt, a stabilizing agent, and at least one reducing agent under conditions enabling the formation of a metal film having a thickness of at least 100 nm.

12. A method of preparing a coating of a silicon substrate, said coating comprising an internal layer forming an electrically insulating film and an external layer forming a copper diffusion barrier, wherein:
A. said internal layer is produced by employing the method according to claim 2;
B. said external layer is produced by:
a) forming, by using a wet process at the surface of the internal layer thus obtained, an organic film containing nanoparticles of nickel or cobalt;
b) bringing the film thus formed into contact with a liquid solution containing at least one metal salt, a stabilizing agent, and at least one reducing agent under conditions enabling the formation of a metal film having a thickness of at least 100 nm.

13. The method according to claim 11, wherein said step B.a) is carried out in non-electrochemical conditions by bringing the free surface of the aforementioned internal layer into contact with a liquid solution containing:
at least one solvent;
at least one diazonium salt;

at least one monomer that is chain-polymerizable by free radical methods and soluble in said solvent; and at least one chemical initiator enabling the formation of radical entities from said diazonium salt.

14. The method according to claim 13, wherein said chain-polymerizable monomer used in step A.a) is a vinylpyridine or a methacrylate and said monomer used in step B.a) is 2-hydroxyethyl methacrylate.

15. The method according to claim 14, wherein said chain-polymerizable monomer used in step A.a) is 4-vinylpyridine or 2-hydroxyethyl methacrylate.

16. The method according to claim 13, wherein said chemical initiator is selected from the group consisting of a metal reducing agent in finely divided form, an organic base and an inorganic base in sufficient proportions for the pH of the liquid solution to be greater than or equal to 4.

17. The method according to claim 11, wherein said chain-polymerizable monomer used in step A.a) is a vinylpyridine and wherein step B.a) is carried out by bringing the free surface of the internal layer of polyvinylpyridine into contact with a liquid solution comprising:

at least one solvent;

at least one polymer that is soluble in said solvent and comprising functional groups capable of bonding with the functional groups of the polyvinylpyridine by hydrogen bonds or Van der Waals bonds, said polymer containing one or more functional groups selected from the group consisting of hydroxyl, (primary or secondary) amine, ammonium, carboxylic acid, carboxylic acid salts, (cyclic or linear) carboxylic anhydride, amide: C(=O)NHR where R represents a hydrogen atom or an alkyl group having 1 to 6 carbon atoms, an amino acid, phosphonic acid, phosphonic acid salts, phosphoric acid, phosphoric acid salts, sulphonic acid, sulphonic acid salts, sulphuric acid, sulphuric acid salts, succinamic acid, succinamic acid salts, phthalimide, phthalimide salts, $Si(OH)_n$ where n is an integer between 1 and 3;

for a sufficient duration to enable the formation of said hydrogen or Van der Waals bonds.

18. The method according to claim 17, wherein said chain-polymerizable monomer used in step A.a) is 4-vinylpyridine and said soluble polymer used in step B.a) is an acrylic polyacid.

19. The method according to claim 11, wherein said salt of said metal salt is selected from the group consisting of the acetate, acetylacetonate, hexafluorophosphate, nitrate, perchlorate, sulphate and tetrafluoroborate.

20. The method according to claim 11, wherein said reducing agent is selected from the group consisting of hypophosphorous acid, hypophosphorous salts, borane derivatives, glucose, formaldehyde and hydrazine.

21. A method of preparing a coating of an electrical conductor or semiconductor substrate, said coating comprising an internal layer forming an electrically insulating film, an intermediate layer forming a copper diffusion barrier, and an external layer forming a copper seed layer, wherein:

A. said internal layer is produced by implementing the method according to claim 1;

B. said intermediate layer is produced by implementing the method according to claim 11; and C. said external layer is produced by:

a) bringing the free surface of the intermediate layer into contact with a liquid solution comprising:

at least one solvent;

copper ions in a concentration of between 14 and 120 mM;

ethylenediamine;

the molar ratio of ethylenediamine to copper being between 1.80 and 2.03; and the pH of said composition being between 6.6 and 7.5;

b) polarizing said free surface of the second layer for a sufficient duration to form said external layer.

22. The method according to claim 21, wherein said liquid solution used in the aforementioned step C.a) comprises cupric ions coming from copper sulphate in an amount between 16 and 64 mM and the molar ratio of ethylenediamine to the copper ions is between 1.96 and 2.0.

23. A wafer of a conductor or semiconductor material comprising one or more vias, wherein the walls of each via are covered with an internal layer made of poly-4-vinylpyridine with a thickness of between 200 and 400 nanometers forming an electrical insulator, wherein the electrical insulator is coated with a layer of nickel or of nickel alloyed with boron, with a thickness of between 100 and 300 nanometers forming a copper diffusion barrier, and wherein the copper diffusion barrier is covered with a copper layer with a thickness of between 200 and 500 nanometers forming a seed layer.

24. A wafer of a conductor or semiconductor material comprising one or more vias, wherein the walls of each via are covered with an internal layer made of poly-2-hydroxyethyl methacrylate with a thickness of between 200 and 400 nanometers forming an electrical insulator, wherein the electrical insulator is coated with a layer of nickel or of nickel alloyed with boron, with a thickness of between 100 and 300 nanometers forming a copper diffusion barrier, and wherein the copper diffusion barrier is covered with a copper layer with a thickness of between 200 and 500 nanometers forming a seed layer.

* * * * *